(12) United States Patent
Mawet

(10) Patent No.: US 6,747,500 B2
(45) Date of Patent: Jun. 8, 2004

(54) COMPACT DELAY CIRCUIT FOR CMOS INTEGRATED CIRCUITS USED IN LOW VOLTAGE LOW POWER DEVICES

(75) Inventor: Patrick H. Mawet, Snohomish, WA (US)

(73) Assignee: Mitutoyo Corporation, Kawasaki (JP)

(*) Notice: Subject to any disclaimer, the term of this patent is extended or adjusted under 35 U.S.C. 154(b) by 0 days.

(21) Appl. No.: 10/000,139

(22) Filed: Oct. 19, 2001

(65) Prior Publication Data

US 2003/0076145 A1 Apr. 24, 2003

(51) Int. Cl.$^7$ ................................................ H03H 11/26
(52) U.S. Cl. ........................................ 327/278; 327/281
(58) Field of Search ................................ 327/143, 276, 327/278, 281, 283

(56) References Cited

U.S. PATENT DOCUMENTS

| | | |
|---|---|---|
| 3,831,113 A | 8/1974 | Ahmed |
| 3,886,485 A | 5/1975 | Takahashi |
| 3,921,101 A | 11/1975 | McCoy et al. |
| 3,995,232 A | 11/1976 | Laugesen |
| 4,115,748 A | 9/1978 | Kubo et al. |
| 4,205,279 A | 5/1980 | Beutler |
| 4,283,690 A | 8/1981 | Tarbouriech |
| 4,370,628 A | 1/1983 | Henderson et al. |
| 4,377,790 A | 3/1983 | Zobel et al. |
| 5,345,195 A | 9/1994 | Cordoba et al. |
| 5,528,182 A * | 6/1996 | Yokosawa .................. 327/143 |
| 5,781,051 A * | 7/1998 | Sandhu ........................ 327/143 |
| 5,886,519 A | 3/1999 | Masreliez et al. |
| 5,901,458 A | 5/1999 | Andermo et al. |
| 5,982,318 A | 11/1999 | Yiannoulos |
| 6,144,330 A | 11/2000 | Hoffman et al. |
| 6,177,901 B1 | 1/2001 | Pan et al. |

OTHER PUBLICATIONS

Johns, D. and K. Martin, *Analog Integrated Circuit Design*, John Wiley and Sons, Inc., 1997, "Advanced Current Mirrors and Opamps" and "Comparators."

* cited by examiner

*Primary Examiner*—Kenneth B. Wells
(74) *Attorney, Agent, or Firm*—Christensen O'Connor Johnson Kindness PLLC

(57) ABSTRACT

A low voltage, low power versatile and compact delay circuit for CMOS integrated circuits. The biasing circuit and comparator of the delay circuit are implemented with a relatively few simple transistor stages. This approach makes the circuit compact and allows for operation at very low supply voltages (e.g., 1.5 volts). The time delay of the delay circuit is made to depend only on passive resistive and capacitive components. The time delay is thus insensitive to fluctuations in the supply voltage, as well as fluctuations in temperature. This configuration is particularly advantageous in circuits where several timing elements need to track with one another, as they can all be formed with resistors and capacitors of the same construction. The design also makes the circuit insensitive to process parameters, as well as later environmental effects due to operating temperature, circuit aging, and the like. A common signal is used to control both a trip point voltage of a comparator and a voltage change rate of a clock ramp signal in the delay circuit, such that variations in voltage supplied to the clock during normal operation does not substantially affect the clock period.

49 Claims, 24 Drawing Sheets

COMPACT DELAY CIRCUIT FOR CMOS INTEGRATED CIRCUITS USED IN LOW VOLTAGE LOW POWER DEVICES

FIELD OF THE INVENTION

The present invention relates to CMOS delay circuits suitable for use in on-chip clocks or oscillators and timing delay circuits, and more particularly, to a low voltage low power compact CMOS delay circuit for use in low voltage low power devices.

BACKGROUND OF THE INVENTION

Delay circuits are commonly utilized in on-chip clocks or oscillators as well as timing delay circuits. Conventional CMOS delay circuits use ramps, comparators, and voltage references to ensure that the delay will not vary with supply voltage and operating temperature. However, these circuits are complex and require a significant amount of chip area, and are difficult to design for low supply voltages.

There are numerous examples of devices which can benefit from circuits incorporating low voltage low power delay circuits. One example of such a device is a displacement measuring instrument, such as a hand-held electronic caliper that can be used for making precise geometric measurements, such as that shown in U.S. Pat. No. 5,901,458, which is commonly assigned and hereby incorporated by reference in its entirety. Another example of such a device is shown in U.S. Pat. No. 5,886,519, which is commonly assigned, and incorporated herein by reference in its entirety. The '519 patent discloses an inductive absolute position transducer for high accuracy applications, such as linear or rotary encoders, electronic calipers and the like. It is obvious that the less power such instruments use, the fewer batteries (or other power sources) they will require and the longer they will operate before the batteries (or other power sources) need to be replaced or replenished. However, reducing the power requirements of such devices is a complex task. Such devices are required to make highly accurate measurements, and the signal processing techniques that have been developed for such are required to both accomplish the desired accuracy and operate at low voltage and power levels, and be relatively insensitive to reasonable variations in supply voltage and operating temperature.

The present invention is directed to a versatile and compact delay circuit that is relatively insensitive to reasonable variations in supply voltage and operating temperature, for inclusion in CMOS integrated circuits that are used in low voltage low power devices.

SUMMARY OF THE INVENTION

The present invention provides a low voltage low power versatile, compact and stable delay circuit for CMOS integrated circuits. In accordance with one aspect of the invention, a common signal is used to control both a trip-point voltage of a comparator and a voltage change rate of a clock ramp signal input to the comparator, such that variations in a voltage supplied to the delay circuit during normal operation will not substantially affect the clock period of the delay circuit.

In accordance with another aspect of the invention, the biasing circuit and a biased transistor comparator of the delay circuit are implemented with a relatively few simple transistor stages. This approach makes the circuit compact and allows for operation at very low supply voltages.

In accordance with another aspect of the invention, the delay circuit may be used in a device that is operable from a power supply providing a voltage less than 1.75 volts (e.g., a single 1.5 volt watch battery or solar cell providing a voltage as low as 1.5 volts nominal, 1.35 volts minimum), and has a current drain compatible with devices which require an overall current drain of a few microamps or less.

In accordance with another aspect of the invention, the delay circuit may be used in systems with voltages higher than 1.5 volts, such as one that is operable from a power supply providing a voltage less than 3.5 volts (e.g., two 1.5 volt watch batteries or solar cells in series). The invention is also advantageous in some applications operating with voltages higher than 3.5 volts.

In accordance with another aspect of the invention, certain components are selected to reduce the sensitivity of the overall system to process parameters. More specifically, by using resistors and capacitors of the same type in circuitry such as a clock/oscillator generator, and by charging the capacitors with scaled bias currents, certain factors (e.g., scale factors) of the system are made to be independent of process parameters, as well as later environmental effects due to operating temperature, circuit aging, and the like.

In accordance with another aspect of the invention, the time delay of the delay circuit is made to depend only on certain passive components, such as resistors and capacitors. The time delay is thus made to be insensitive to variations in supply voltage and reference voltage levels. This enables the circuit to be implemented with simple transistor stages without introducing excessive variations in the time delay that could otherwise be caused by changes in operating temperature or changes in voltage levels. This is particularly advantageous in circuits where several timing elements need to track with one another, since these different timing elements can be constructed with similar resistors and capacitors.

In accordance with another aspect of the invention, the ramp generator of the present invention can be implemented with relatively simple circuitry, and consequently be of a small size and operable from low voltage. An operating speed limitation of the system is due to the nature of the ramp itself, since a ramp inherently takes time to transition. However, since high-speed operation is not a critical factor in the signal processing of a variety of devices (e.g., certain portable or handheld measuring instruments), this implementation provides an effective tradeoff of a slower system for one that uses less power, is of a smaller size and is operable from low voltage.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

The present invention provides a compact, efficient delay circuit that can operate at a low supply voltage. Conventional delay circuits use ramp, conventional comparators, and conventional voltage references to ensure that the delay will not vary with the supply voltages and operating temperatures. However, these circuits are complex and require a significant amount of chip area, and are difficult to design for very low supply voltages. The present invention utilizes self-compensation and simple transistor stages to accomplish the same functions in a more efficient manner. Some of the advantages of the present invention are that the transistor stages have less parasitic delays, are smaller, simpler, and require less current than the conventional circuitry used in delay circuits.

Figure 1:
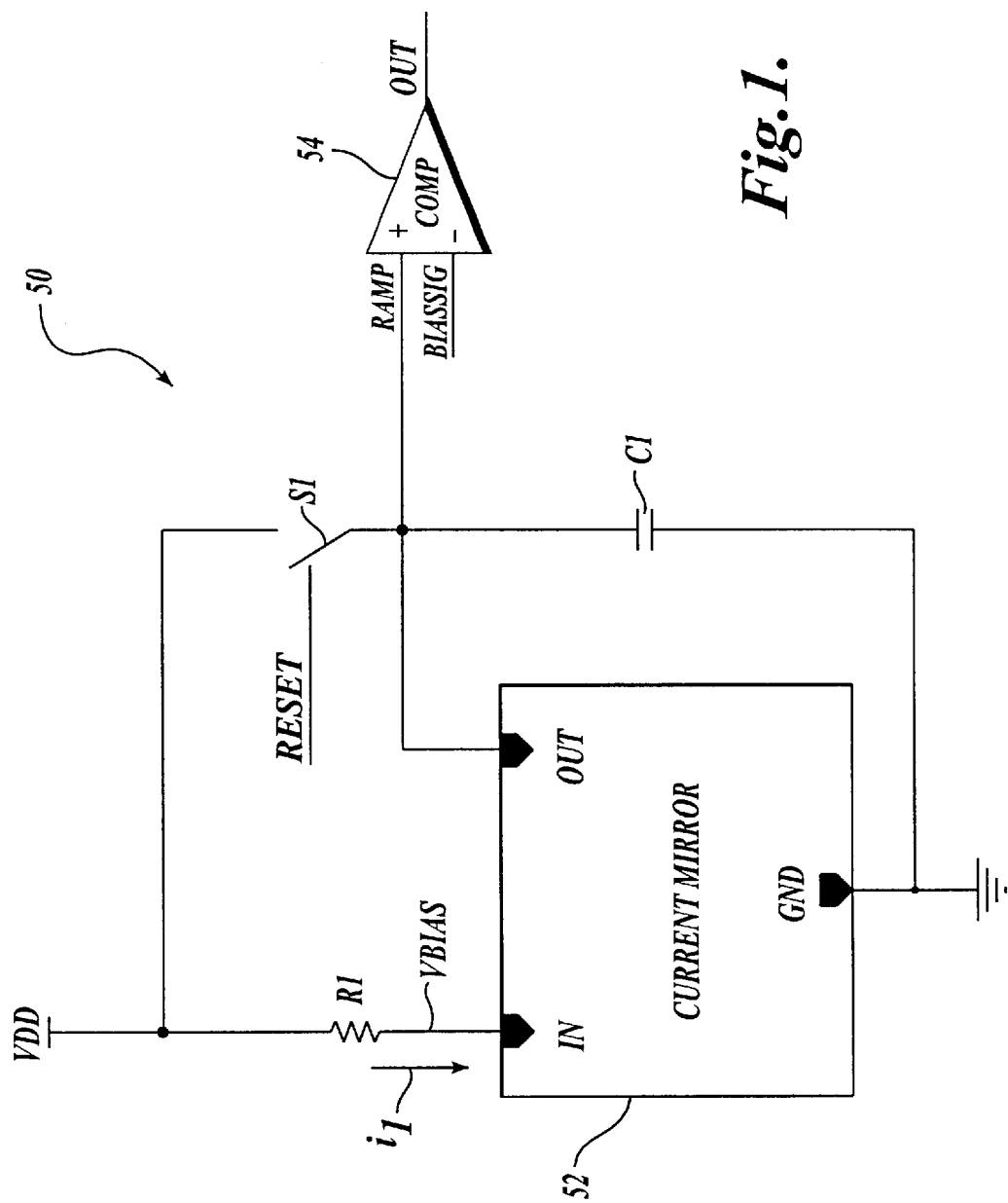
FIG. 1 is a block diagram of a basic delay circuit illustrating the operating principles of the present invention.

FIG. 1 is a block diagram of a basic delay circuit 50 illustrating the operating principles of the present invention.

As shown, a current mirror 52 is coupled in its first branch through a resistor R1 to the power supply voltage VDD. In addition, a current $i_1$ is established in the first branch of the current mirror 52. The node between the resistor R1 and the first branch of the current mirror 52 determines the signal VBIAS. The second branch of the current mirror 52 is coupled to a positively labeled input of a comparator 54. Various exemplary embodiments of the comparator 54 are described in detail further below. A signal RAMP is designated as the signal at the positively labeled input of the comparator 54. The positively labeled input of the comparator 54 is also coupled through a switch S1 to the power supply voltage VDD. Switch S1 is controlled by a signal RESET. The positively labeled input of the comparator 54 is also coupled through a capacitor C1 to ground. The switch S1, the capacitor C1, and the second branch of the current mirror 52 all form a ramp circuit. The negatively labeled input of the comparator 54 receives a signal BIASSIG which determines the trip point or switch point of the comparator 54, as described in greater detail below.

A ramp signal is generated by discharging the capacitor C1 with the current $i_2$. The reference current $i_1$ is set by the bias resistor R1. The current mirror input voltage is maintained at the voltage VBIAS. The current mirror outputs an operating current $i_2$ identical to (or a multiple of) $i_1$. The current $i_1$ is given by:

$$i_1 = \frac{VDD - VBIAS}{R1} \quad \text{(Eq. 1)}$$

$$i_2 = k \cdot i_1 \quad \text{(Eq2)}$$

k is the current mirror ratio established by the physical dimensions of the transistors of the current mirror, typically an integer number. The reference current can be set to a fraction of the required operating current to minimize current drain.

When the switch S1 opens, the capacitor C1 discharges at the rate:

$$\frac{dv}{dt} = \frac{i_2}{C1} \quad \text{(Eq. 3)}$$

The comparator 54 will trip or switch when the capacitor signal RAMP reaches a switching voltage VSWITCH, which is determined by the bias signal BIASSIG which governs the operation of the comparator 54. When a conventional comparator is used for the comparator 54, the switching voltage VSWITCH is equal to a reference voltage supplied to the comparator as the signal BIASSIG. In other exemplary embodiments described further below, the signal BIASSIG is not the same as the switching voltage VSWITCH, but the switching voltage VSWITCH is dependent on or interdependent with the signal BIASSIG. The time delay is defined by the time elapsed from the falling edge of the reset signal to the falling edge of the comparator output (OUT), or:

$$t_d = \frac{VDD - VSWITCH}{dv/dt} \quad \text{(Eq. 4)}$$

The time delay $t_d$ can be expressed as a function of the circuit parameters:

$$t_d = \frac{R1 \cdot C1}{k} \cdot \frac{VDD - VSWITCH}{VDD - VBIAS} \quad \text{(Eq. 5)}$$

According to one aspect of the present invention, it should be appreciated that to the extent that a circuit design causes the voltages VSWITCH and VBIAS to approach the same value, the time delay interval determined by the delay circuit will tend to be stabilized against variations in the supply voltage. Furthermore, by making the voltages VSWITCH and VBIAS equal, the time delay will depend only on the resistor and capacitor values, and on the current mirror ratio k:

$$t_d = \frac{R1 \cdot C1}{k} \quad \text{(Eq. 6)}$$

In this manner, the time delay is made to depend only on the passive components R1 and C1 and the current mirror ratio k. Thus, the time delay is made to be insensitive to changes in the supply voltage and reference voltage levels. Furthermore, when the transistors which are factors in the current mirror ratio k are fabricated in a common process, their operating characteristics will tend to track each other and the time delay interval determined by the delay circuit will tend to be additionally stabilized against variations with the operating temperature of the delay circuit. This enables the circuit to be implemented with simple transistor stages without introducing excessive variations due to supply voltage and temperature changes. Furthermore, in various exemplary embodiments, the passive components R1 and C1 are also fabricated in a common process. This is particularly advantageous in circuits where several delay circuits and their related timing elements need to track with one another, as they can all be generated with resistors and capacitors of the same construction.

A key aspect of this invention is how both the biasing circuit and the comparator can be implemented with a few simple transistor amplifier stages. This approach makes the circuit compact and also allows for operation at very low supply voltages (e.g., 1.5 volts).

Figure 2:
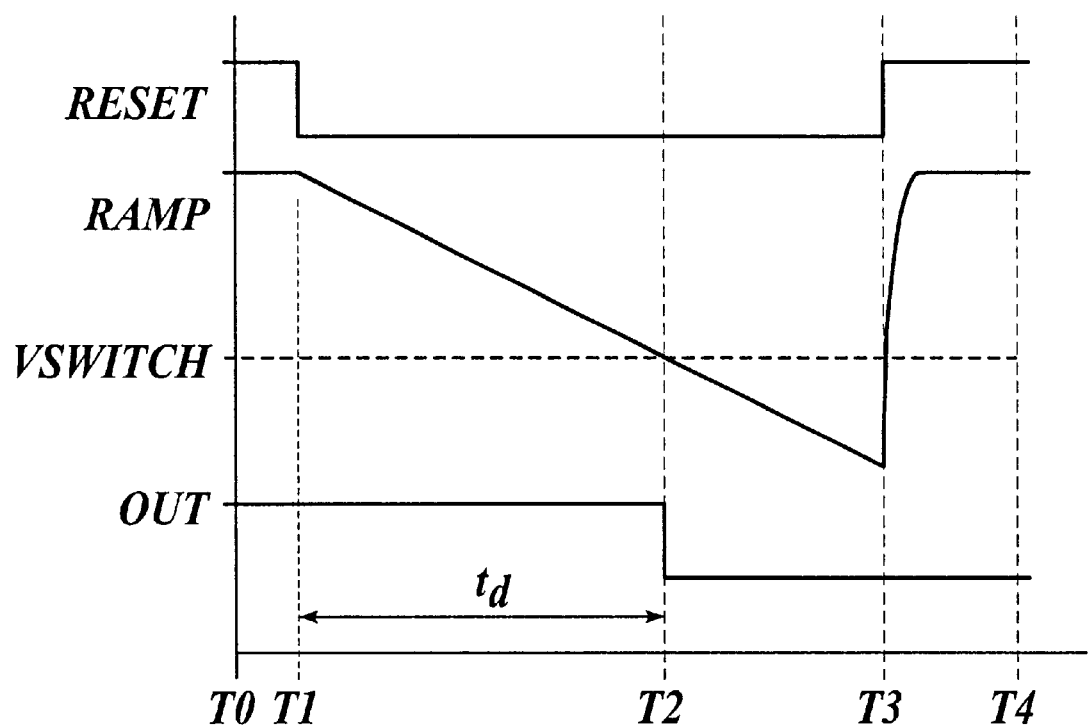
FIG. 2 is a timing diagram illustrating the operation of the circuitry of FIG. 1.

FIG. 2 shows timing diagrams illustrating the operation of the delay circuit 50 of FIG. 1. As illustrated, at time T0 the signal RAMP is high, and the signal RESET is also high. At a time T1, the signal RESET transitions low, which causes the ramp signal RAMP to begin transitioning downwards from the power supply voltage VDD at a linear slope. At a time T2, the ramp signal RAMP reaches the signal level VSWITCH, which causes the output OUT of the comparator 54 to transition from high to low. The time delay $t_d$ is equal to the difference between times T2 and T1. At time T3, the signal RESET transitions high so as to close the switch S1 and tie the signal RAMP to the power supply voltage VDD. The signal RAMP thus transitions upward to the supply voltage VDD, where it is seen at time T4.

Figure 3:
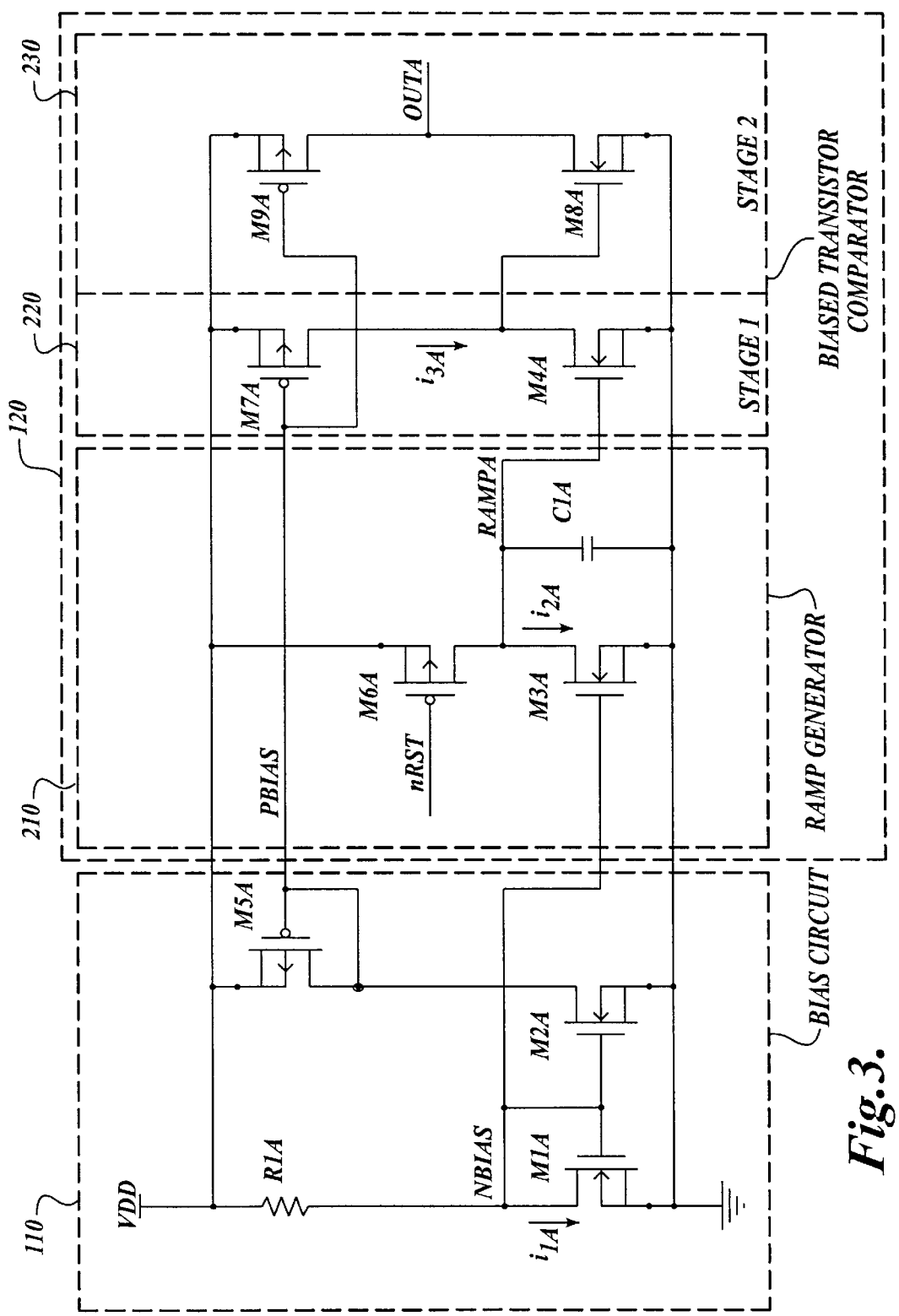
FIG. 3 is a schematic diagram illustrating one embodiment of the delay circuit of FIG. 1.

FIG. 3 is a schematic diagram of one embodiment of the delay circuit of FIG. 1. As shown in FIG. 3, the delay circuit 100 includes a bias circuit 110 and a delay block 120. The delay block 120 includes a ramp generator 210, and a biased transistor comparator according to one aspect of this invention with a first stage 220 and a second stage 230.

The bias circuit 110 includes two NMOS transistors M1A and M2A coupled in a current mirror configuration. The first branch of the current mirror receives a current $i_{1A}$, which flows from the supply voltage VDD through a resistor R1A. The second branch of the current mirror is coupled through a PMOS transistor M5A to the supply voltage VDD. The node between the resistor R1A and the first branch of the current mirror determines the signal NBIAS. The node between the transistors M5A and M2A determines the signal PBIAS.

The ramp generator 210 includes an NMOS transistor M3A, which is biased by the signal NBIAS. The transistor M3A is coupled in series with a transistor M 6 A to the supply voltage VDD. The transistor M6A is controlled by a signal NRST. The current through the transistor M3A is designated as $i_{2A}$. A capacitor C1A is coupled in parallel with the transistor M3A. The node on the capacitor C1A is designated as signal RAMPA.

Both the first stage 220 and the second stage 230 of the comparator include one PMOS and one NMOS transistor coupled in series between the supply voltage VDD and ground. In the first stage 220, the NMOS transistor M4A is controlled by the signal RAMPA, while the PMOS transistor M7A is biased by the signal PBIAS. The node between the transistors M4A and M7A is coupled to the gate of NMOS transistor M8A of the second stage 230. The current between the transistor M4A and the transistor M7A is designated as a current $i_{3A}$. The second stage 230 also includes a PMOS transistor M9A, which is also biased by the signal PBIAS. The node between the transistors M8A and M9A is designated as the output OUTA.

To analyze the circuitry of FIG. 3, it can initially be seen that the bias current $i_{1A}$ is established by resistor R1A and transistor M1A. The voltage level NBIAS will be the gate voltage needed to drive transistor M1A at the bias current $i_{1A}$. The NMOS transistors M2A and M3A mirror the bias current $i_{1A}$. The mirrored current at the level $i_{1A}$ also flows through PMOS transistor M5A, and thus determines the signal PBIAS based on the operating characteristics of the transistor M5A. The signal PBIAS then causes the transistors M7A and M9A to mirror the same bias current in the biased transistor comparator stages. This assumes that all the PMOS and NMOS transistors have respectively the same dimensions (k=1). In a practical implementation, the bias stage may operate at a lower current to save power, but with all the current mirror transistors operating at the same current density (k>1). To simplify the circuit description, we will assume that k=1. Various alternatives will be apparent to one skilled in the art.

For the ramp generator 210, the transistor M3A will discharge the capacitor C1A at the current $i_{2A}$, equal to the bias current $i_{1A}$. Transistor M6A is the reset switch, driven by the active low signal NRST.

According to one aspect of operation according to this invention, in order for this delay circuit to behave according to the discussion of Equation 6, the comparator needs to trip at the voltage NBIAS. This is accomplished by applying the signal PBIAS to the transistor M7A (and M9A), so the same bias current is further mirrored in the biased transistor comparator stages, in order to bias the transistor M4A at the same current density as transistor M1A. When the signal RAMPA is high, transistor M4A will be on and driven by the transistor M7A (current mirror output) and $i_{3A}=i_{1A}$.

When the capacitor C1A discharges, the signal RAMPA will decrease linearly. When signal RAMPA reaches the same voltage as the signal NBIAS, the transistor M4A will turn off and the biased transistor comparator will trip. Thus, it should be appreciated that the signal NBIAS is analogous to the voltage VBIAS in FIG. 1, and that the signal PBIAS is analogous to the signal BIASSIG of FIG. 1. Furthermore, it should be appreciated that according to this circuit configuration, for a given set of transistor operating characteristics, the signal PBIAS is determined by the signal NBIAS. This accomplishes one aspect of operation according to this invention, that is, it is insured that the comparator switching voltage is the same as the bias voltage NBIAS, in a manner that fulfills the conditions of Equation 6. Typically, transistors M8A and M9A form a second stage to increase the gain and square off the output signal OUTA.

It should be appreciated that the biased transistor comparator described above is not a conventional comparator and is not governed by a conventional reference voltage. Thus, conventional reference voltage circuits, along with their energy-dissipating resistors and independent circuit variations, are eliminated. Furthermore, comparator-like switching is accomplished with as little as one biasing transistor (e.g.-M7A) and one switching transistor (e.g.-M4A). Thus, the circuit can operate at very low supply voltages and provide very fast switching. In many applications, as long as VDD is a few hundred mV above the NMOS threshold voltage, the circuit will operate. In some embodiments, with higher operating voltages, the circuit will be stable and more accurate, as noise and offsets will have less effect. If high speed and/or high accuracy are required, a large number of additional exemplary circuit embodiments according to this invention may be derived from the circuit of FIG. 3 by adding operably connected cascode transistors to augment the operation of any or all of the transistors shown in FIG. 3, as will be readily apparent to one skilled in the art. However, this will require a slightly higher (by a few hundred mV) minimum supply voltage. In low power circuits, where the operating speeds are typically lower, the same effect can be obtained by using longer transistors. Regarding the use of cascode transistors in current mirror configurations, the reader is referred to the chapter titled "Advanced Current Mirrors and Opamps" in *Analog Integrated Circuit Design* by David Johns and Ken Martin, published by John Wiley and Sons, Inc., 1997. It will be appreciated by one skilled in the art that when a cascode transistor is used to augment one or more of the transistors in one of the series connected pairs of transistors such as M2A and M5A, M3A and M6A, M4A and M7A, and M8A and M9A, as shown in FIG. 3, the affected pair(s) will generally no longer be connected directly in series, but will generally still be coupled in series through the augmenting cascode transistor(s). In addition, various gate connections shown in FIG. 3 may be slightly modified with the addition of various cascode transistors. These and other possible circuit modifications associated with adding cascode transistors will be readily apparent to one skilled in the art.

The circuit of the present invention has many useful applications in delay and oscillator/clock circuits. One such application is in on-chip clocks with no external components. The circuit is particularly advantageous if the absolute value of the clock frequency is not so critical, and even more particularly for low-voltage IC's. As noted above, the circuit is also particularly advantageous where several timing elements need to track with one another despite variations in fabrication, operating supply voltage and/or operating temperature of the circuit. Moreover, the accuracy of the clock frequency can be improved by trimming the bias resistor (using fuses with a resistor array for example).

The circuit is also advantageous in many applications of delay circuits. One such application is in programmable delay circuits that can be made by using an array of capacitors and/or resistors. As will be described in more detail below, several tracking delay circuits can be generated from the same bias circuit.

Figure 4:
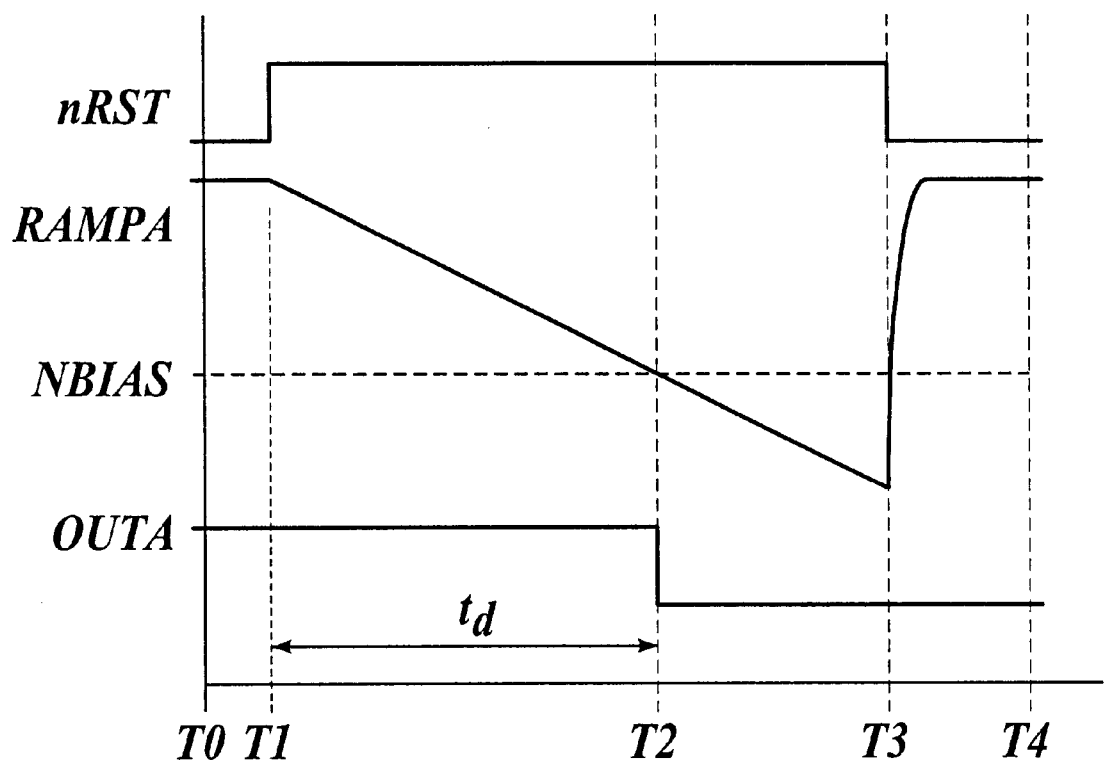
FIG. 4 is a timing diagram illustrating the operation of the circuitry of FIG. 3.

FIG. 4 shows a timing diagram illustrating the operation of the circuitry of FIG. 3. The operation is similar to that described above for the timing diagram of FIG. 2. As shown in FIG. 4, at time T0 the signal NRST is low, and the signal RAMPA is high. At time T1, the signal NRST transitions high, thus causing the signal RAMPA to begin transitioning downward. At time T2, the signal RAMPA passes the voltage level NBIAS, thus causing the comparator to transition, and the output signal OUTA to transition low. The time delay $t_d$ is equal to the difference between times T2 and T1. At time T3, the signal NRST transitions low, thus causing the signal RAMPA to begin transitioning upward towards the supply voltage VDD. At time T4, the signal RAMPA is shown to be high, at the supply voltage VDD.

Figure 5:
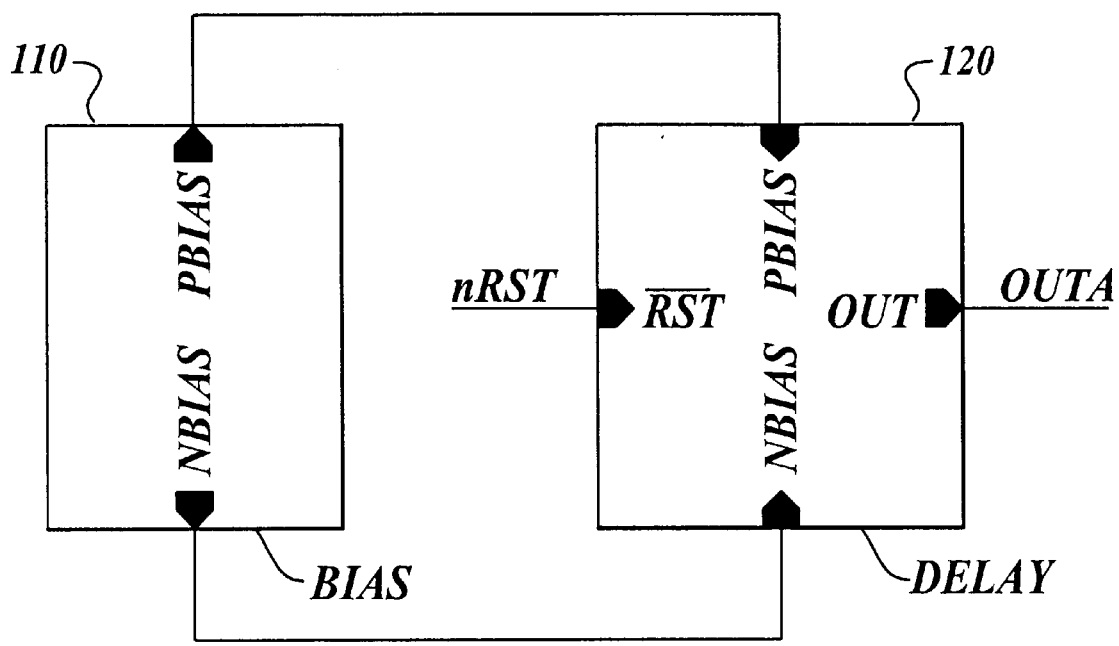
FIG. 5 is a block diagram representing the bias and delay circuitry of FIG. 3.

FIG. 5 is a block diagram of the circuitry of FIG. 3. As illustrated, the circuit may be divided into two basic blocks. The bias circuit 110 is designated as a first block, and the delay block 120 is designated as a second block. As noted above, the delay block 120 includes the ramp generator 210, as well as the first stage 220 and the second stage 230 of the comparator.

The basic components of FIG. 5 can be easily adapted to various applications as will be described in more detail below. Several delay blocks can be driven by a common bias circuit to create several synchronized timing delay outputs. One special case is an oscillator using two delay blocks. Multiple delays can be identical, or different (but tracking despite variations in fabrication, operating supply voltage and/or operating temperature of the circuit), using capacitor and/or current ratios. Adjustable delays can be created by varying either the bias current (e.g., with an adjustable resistor), or the delay block (e.g., with an adjustable capacitor or current mirror). The most common method is to use binary weighted resistor and capacitor arrays. It will be understood that different arrangements and various parallel/series combinations are possible, depending on the desired application.

Figure 6:
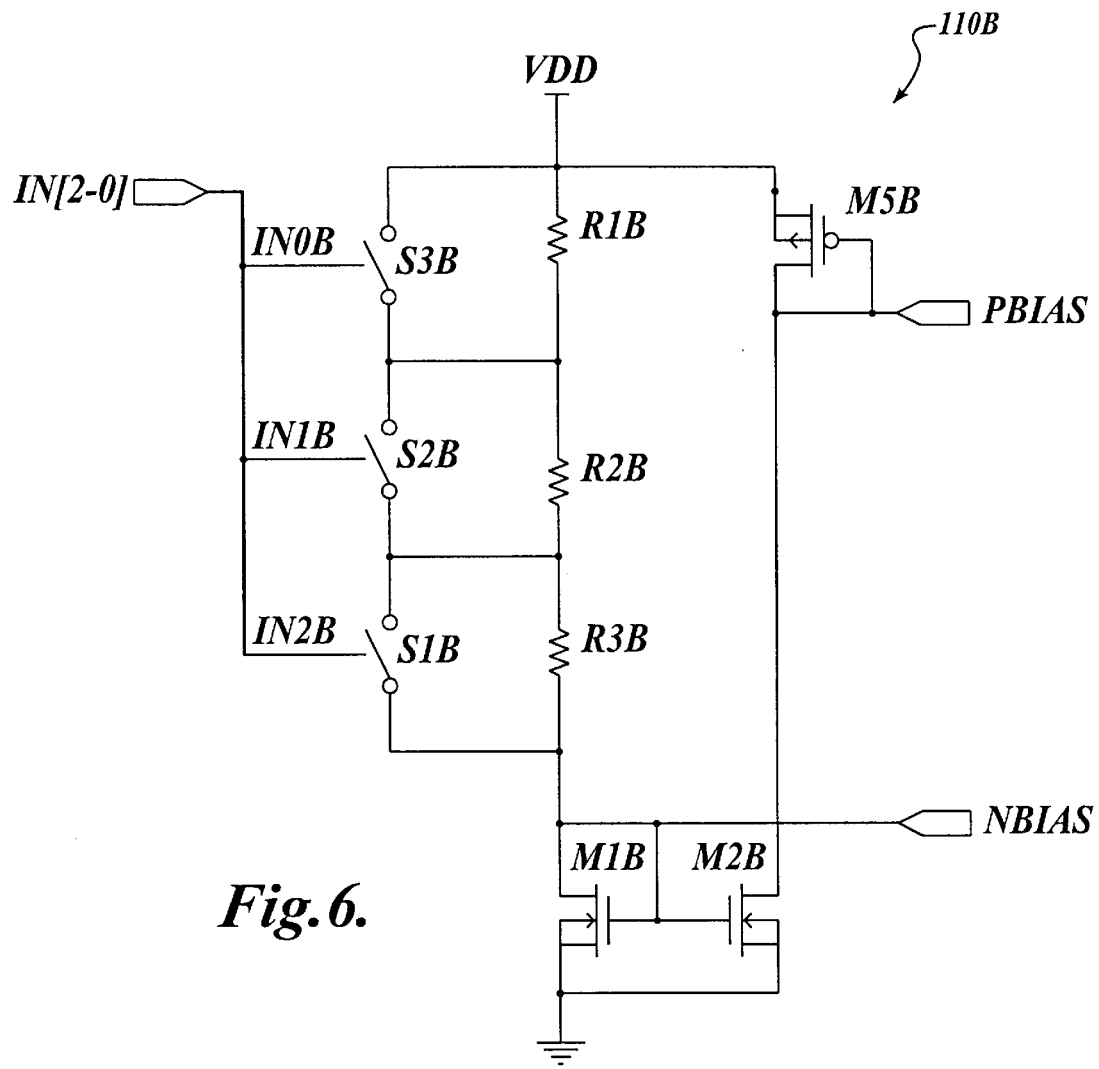
FIG. 6 is a schematic diagram illustrating one embodiment of an adjustable bias circuit for use in a delay circuit.

FIG. 6 shows an example of an adjustable bias circuit, using a three bit control input. It will be understood that in actual practice the control bit input may be much larger and more complex. An adjustable bias circuit such as that shown in FIG. 6 can be used to control the delay of one or several delay blocks together. As shown in FIG. 6, a series of three switches S3B, S2B, and S1B are coupled in series between the supply voltage VDD and two transistors M1B and M2B in a current mirror configuration. A series of resistors R1B, R2B and R3B are coupled in parallel with the switches S3B, S2B, and S1B, respectively. The switches S1B, S2B, and S3B are controlled by control signals IN2B, IN1B, and IN0B, respectively. The current mirror transistors M1B and M2B are biased by a signal NBIAS. A PMOS transistor M5B is coupled between the supply voltage VDD and the transistor M2B, and is biased by the signal PBIAS. The node between the transistor M5B and the transistor M2B is at the bias signal level PBIAS.

Figure 7:
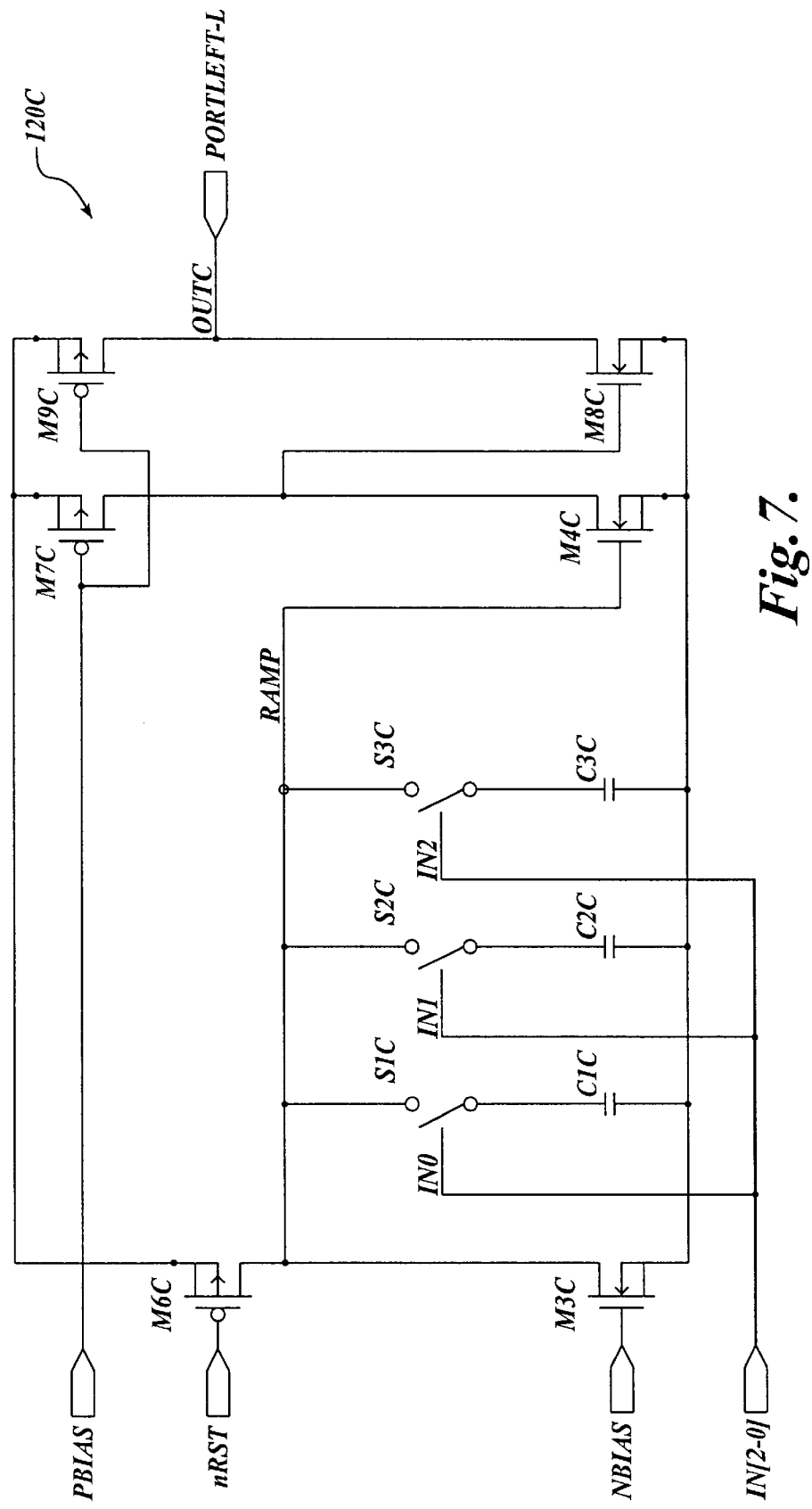
FIG. 7 is a schematic diagram illustrating one embodiment of an adjustable delay block for use in a delay circuit.

FIG. 7 shows an example of an adjustable delay block 120 using an array of capacitors. This configuration allows for the delay of one individual delay block to be adjustable and tracking other adjustable or fixed delay blocks. As shown in FIG. 7, three switches S1C, S2C, and S3C are coupled in parallel between a node at the signal level RAMP and respective capacitors C1C, C2C, and C3C. The switches S1C, S2C, and S3C are controlled by control signals IN0, IN1, and IN2, respectively. An NMOS transistor M3C and a PMOS transistor M6C are coupled in series, and are controlled by the signals NBIAS and NRST, respectively. The node between the transistors M6C and M3C is at the signal level RAMP. Transistors M4C, M7C, M8C, and M9C form the first and second stages of the comparator of the adjustable delay block 120.

Figure 8:
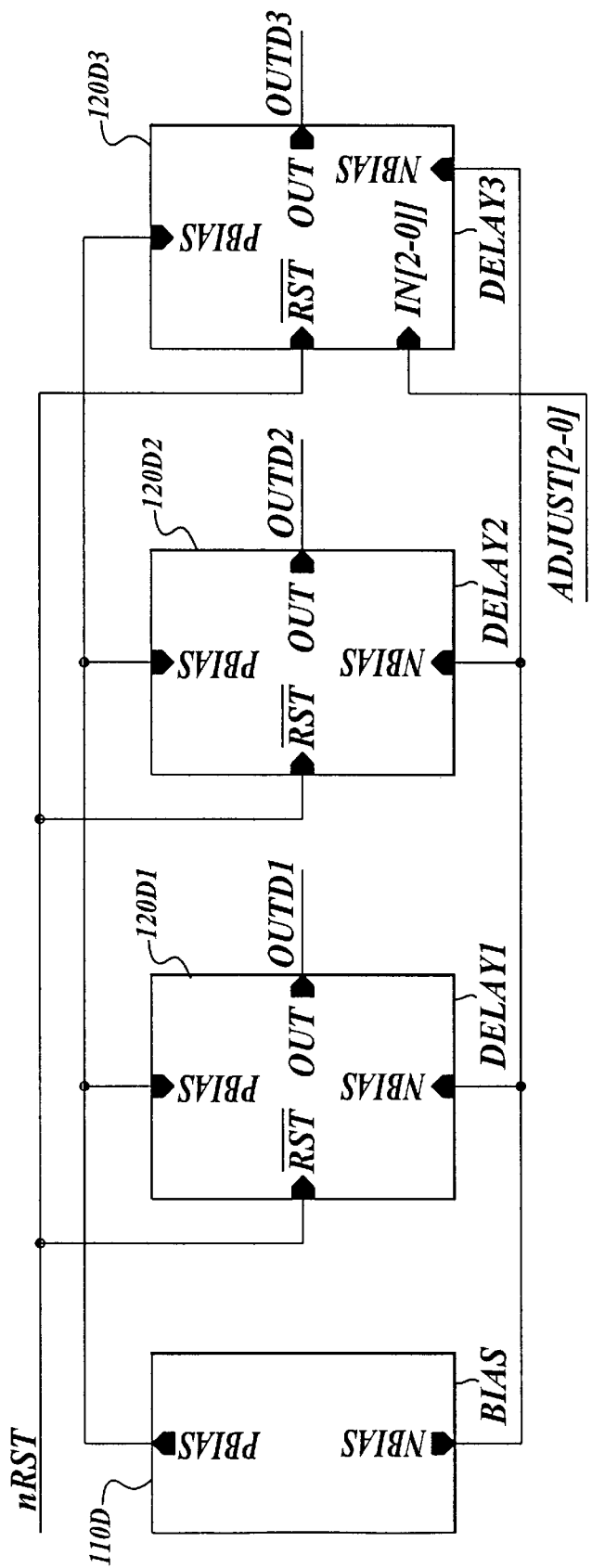
FIG. 8 is a block diagram of a delay circuit utilizing three synchronized delay blocks.
Figure 9:
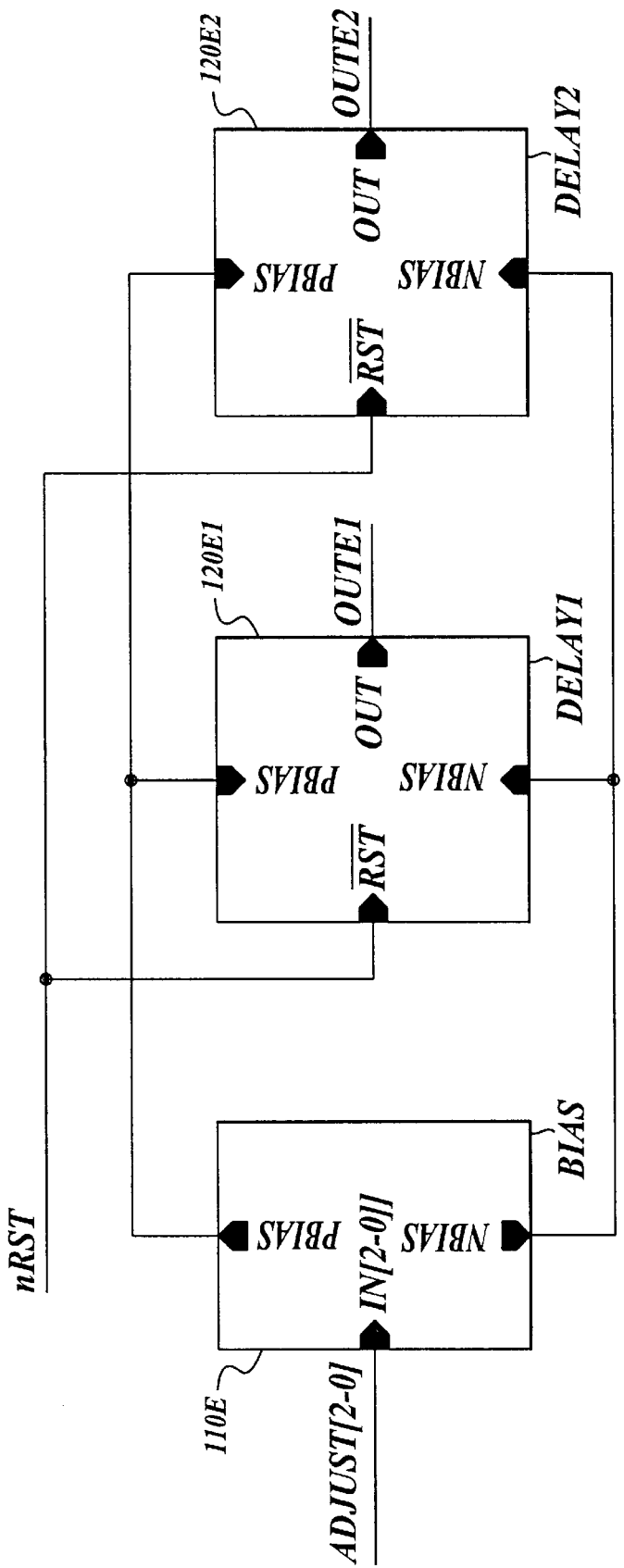
FIG. 9 is a block diagram of a delay circuit utilizing two synchronized delay blocks.

FIGS. 8 and 9 show delay circuit applications. FIG. 8 shows an array of three synchronized delay blocks, all controlled by the same control signal NRST. The third delay block is an individually adjustable delay block. More specifically, as shown in FIG. 8, the bias block 110D is coupled to three synchronized delay blocks 120D1, 120D2, and 120D3. The delay blocks 120D1, 120D2, and 120D3 provide outputs OUTD1, OUTD2, and OUTD3, respectively.

FIG. 9 shows a second example of a delay circuit application. As shown in FIG. 9, two synchronized delay blocks 120E1 and 120E2 are provided, with a common adjustable bias circuit 110E. The delay blocks 120E1 and 120E2 provide outputs OUTE1 and OUTE2, respectively. Both of the delay blocks 120E1 and 120E2 receive the control signal NRST.

Figure 10:
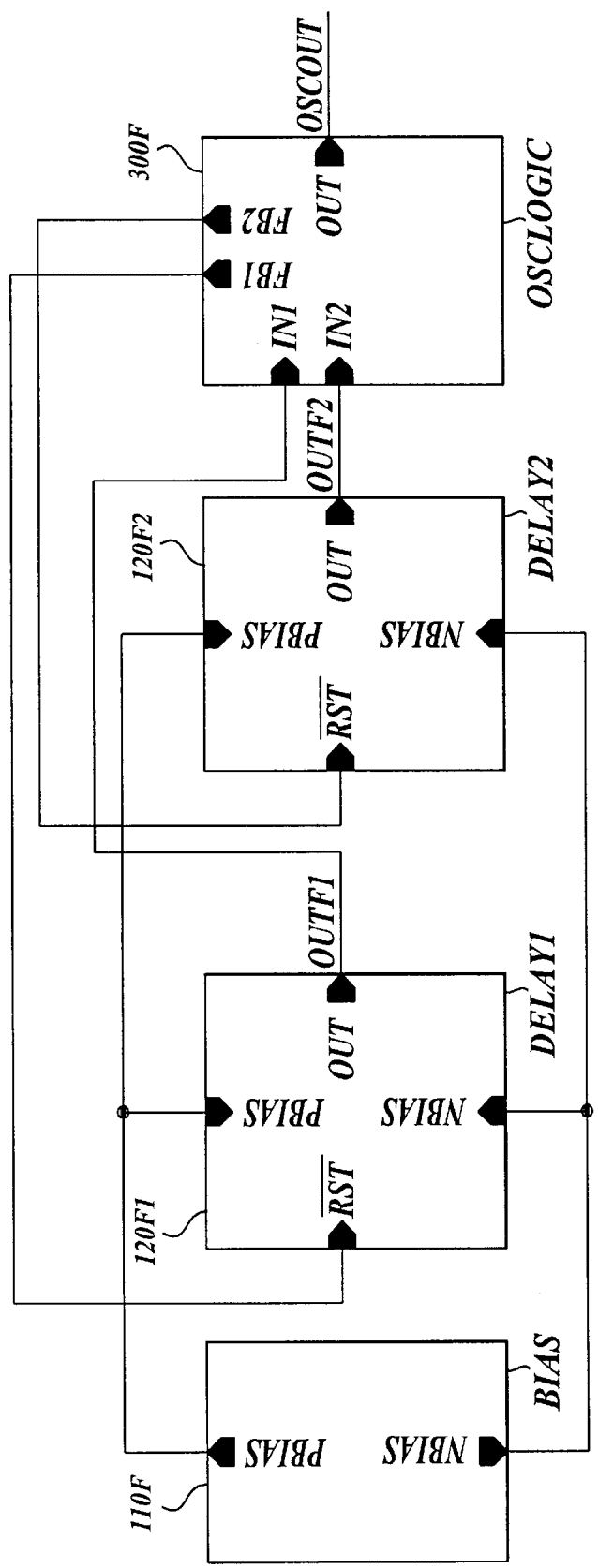
FIG. 10 is a block diagram of an oscillator/clock generator utilizing two delay blocks.

FIG. 10 is a block diagram of an oscillator/clock circuit. As illustrated in FIG. 10, a bias circuit 110F and two delay blocks 120F1 and 120F2 are arranged to make an oscillator by adding a logic and feedback circuit 300F. This type of oscillator can be used to create an on-chip clock that does not require any external components.

Figure 11:
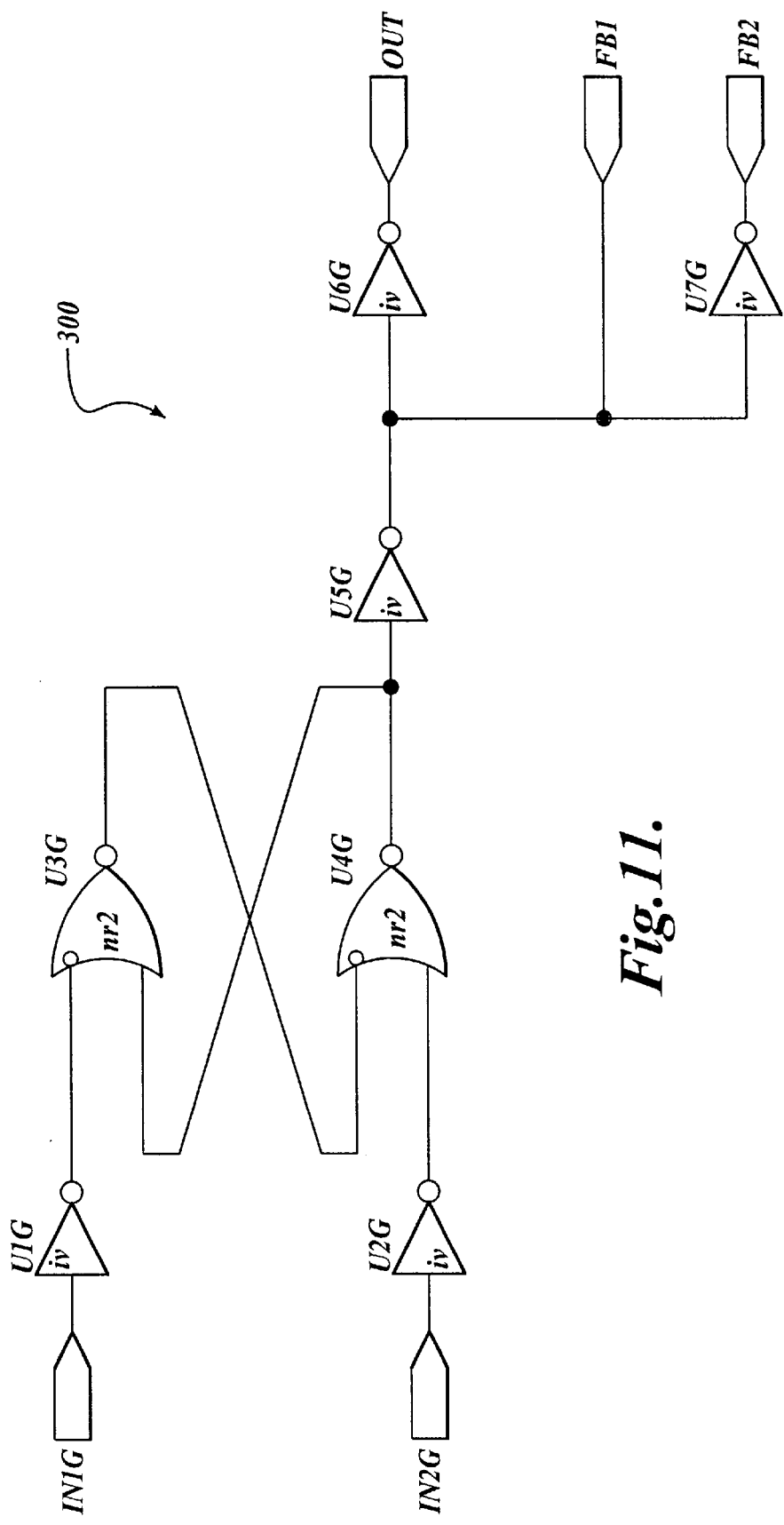
FIG. 11 is a block diagram of one embodiment of an oscillator logic block of FIG. 10.

FIG. 11 shows one exemplary logic circuit 300 suitable for use in the oscillator/clock circuit of FIG. 10. The logic circuit 300 includes five inverters U1G, U2G, U5G, U6G, and U7G. The logic circuit also includes two OR gates U3G and U4G. The inverters U1G and U2G are coupled between the inputs IN1G and IN2G and the inputs of the OR gates U3G and U4G, respectively. The other inputs of the OR gates U3G and U4G are coupled to each other's outputs, respectively. The output of the OR gate U4G is coupled to the input of inverter U5G.

The output of inverter U5G is coupled to the inputs of inverters U6G and U7G. The output OUT is provided from the output of the inverter U6G. The output FB1 is provided from the output of the inverter U5G, and the output FB2 is provided from the output of the inverter U7G. Alternative logic circuits suitable for use in the oscillator/clock circuit of FIG. 10 will apparent to one skilled in the art.

Figure 12:
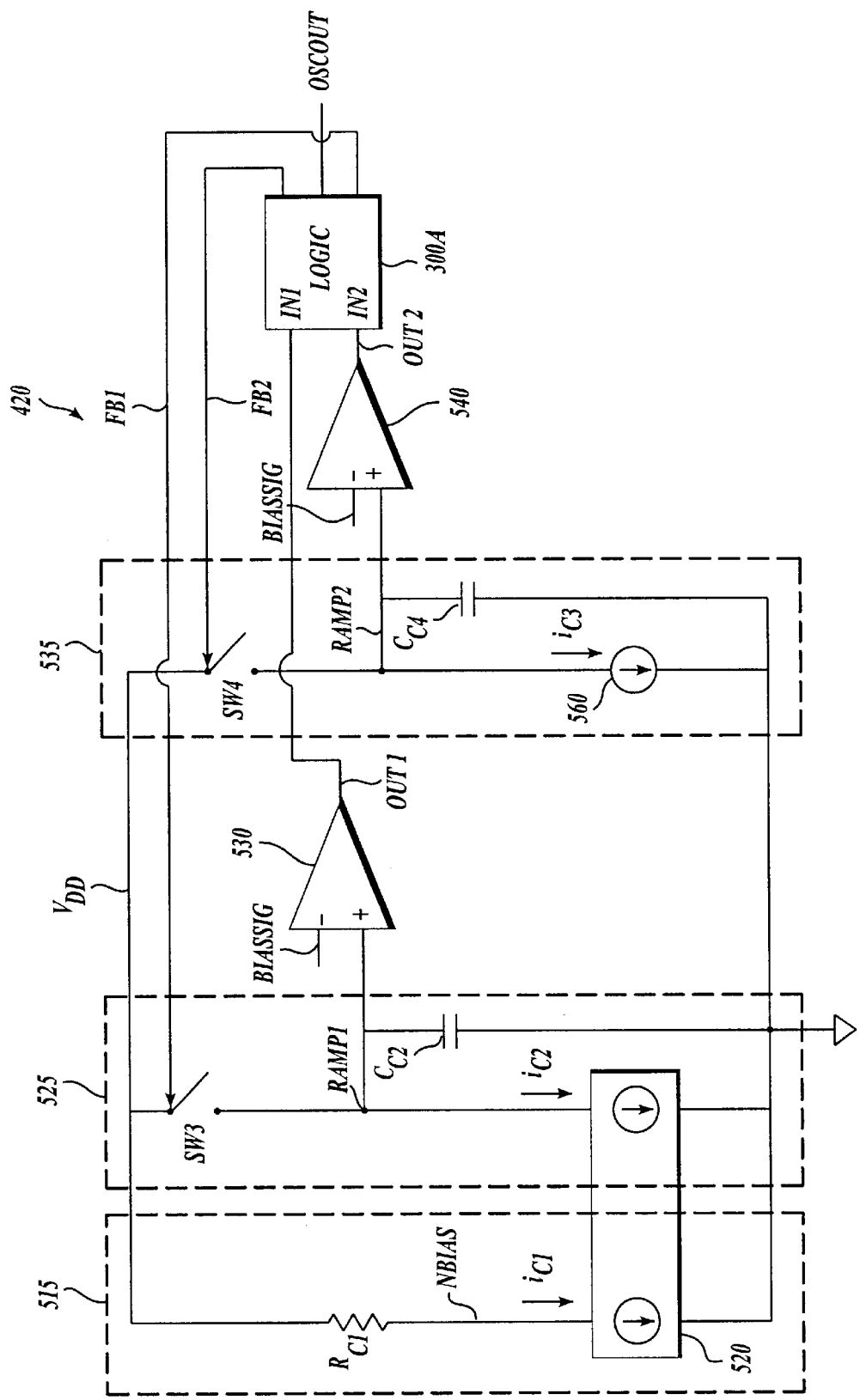
FIG. 12 is a detailed block diagram of a oscillator/clock generator according to this invention.

FIG. 12 is a detailed block diagram of an exemplary embodiment of an oscillator/clock generator according to this invention. As shown in FIG. 12, a current mirror 520 is coupled in its first branch through a resistor $R_{C1}$ to the power supply voltage VDD and a current $i_{C1}$ is established in the current mirror. The node between the resistor $R_{C1}$ and the first branch of the current mirror 520 determines the signal NBIAS=VDD–($R_{C1}*i_{C1}$). The resistor $R_{C1}$ and the first branch of the current mirror 520 form a current setting circuit 515. The second branch of the current mirror 520 is coupled to the positively labeled input of a comparator 530. A signal RAMP1 is designated as the signal at the positively labeled input of the comparator 530. The positively labeled input of the comparator 530 is also coupled through a switch SW3 to the power supply voltage VDD. Switch SW3 is controlled by a signal FB1 from a logic circuit 300A. The positively labeled input of the comparator 530 is also coupled through a capacitor $C_{C2}$ to ground. The components switch SW3, capacitor $C_{C2}$, and second branch of the current mirror 520 all form a ramp circuit 525. The negatively labeled input of the comparator 530 receives a signal BIASSIG which governs the operation of the comparator 530 and sets its switch point at the voltage level NBIAS. When a conventional comparator is used for the comparator 530, BIASSIG is a reference voltage signal set at the level NBIAS. In other exemplary embodiments described further below, the signal BIASSIG is not the same as the switching voltage, but the switching voltage is dependent on or interdependent with the signal BIASSIG. The output of the comparator 530 is provided to the logic circuit 300A.

The output of a comparator 540 is also provided to the logic circuit 300A. Similar to the comparator 530, the comparator 540 receives the signal BIASSIG at its negatively labeled input. The positively labeled input of the comparator 540 is coupled through a capacitor $C_{C4}$ to ground. A current source 560 is also coupled to the positively labeled input of the comparator 540. A switch SW4 also couples the positively labeled input of the comparator 540 to the power supply voltage VDD. Switch SW4 is controlled by a control signal FB2 from the logic circuit 300A. The signal on the positively labeled input of the comparator 540 is designated as signal RAMP2. The output of the logic circuit 300A is the signal OSCOUT. The components switch SW4, capacitor $C_{C4}$, and current source 560 form a ramp circuit 535.

Figure 13:
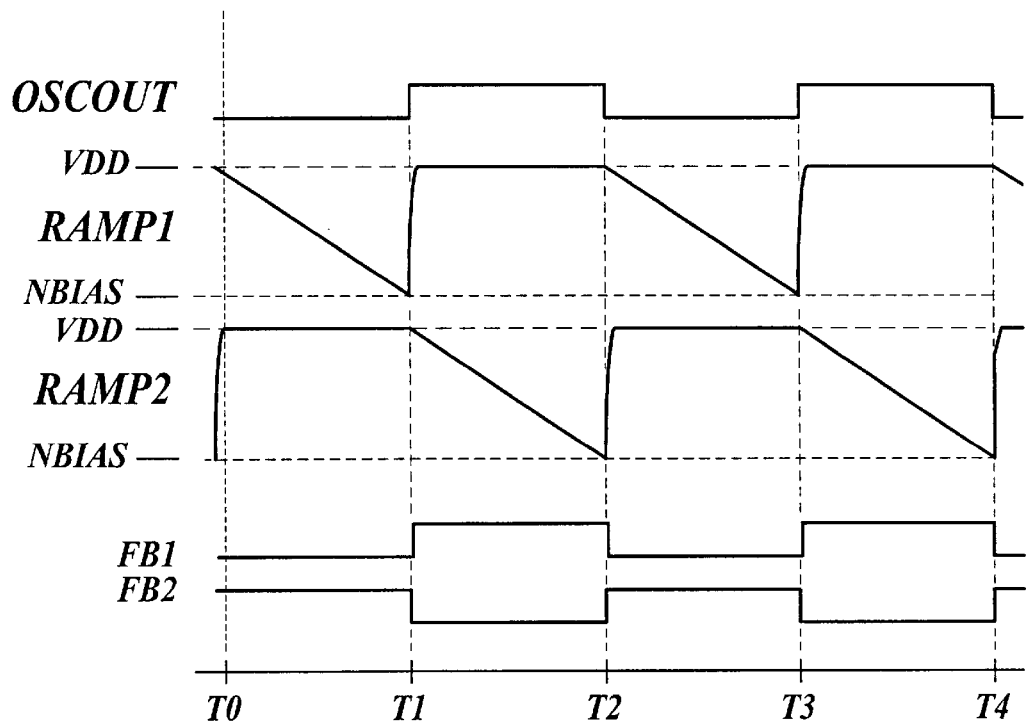
FIG. 13 is a timing diagram illustrating the operation of the oscillator/clock generators of FIGS. 10 and 12.

FIG. 13 shows timing diagrams illustrating the operation of the oscillator/clock generator of FIG. 12. As illustrated, at a time T0 both the signals RAMP1 and RAMP2 are high, and the clock signal FB1 is low, while the clock signal FB2 is high. Because the clock signal FB1 is low at time T0, the switch SW3 is opened and the ramp signal RAMP1 begins transitioning downward from the power supply voltage VDD at a linear slope. At a time T1, the ramp signal RAMP1 reaches the signal level NBIAS, which causes the output OUT1 of the comparator 530 to transition. Thus, at the time T1, the transitioning of the output OUT1 at the IN1 node of logic circuit 300A causes the logic circuit 300A to transition. At time T1 the logic circuit 300A transitions the signal FB1 high so as to close the switch SW3 and tie the signal RAMP1 to the power supply voltage VDD. The signal FB2 is also transitioned low so as to open a switch SW4, thus allowing the signal RAMP2 to begin transitioning downward from the power supply voltage VDD at a linear slope.

At a time T2, the ramp signal RAMP2 reaches the signal level NBIAS, which causes the output OUT2 of the comparator 540 to transition. The transitioning of the output OUT2 at the IN2 node of logic circuit 300A causes the logic circuit 300A to transition. The logic circuit 300A thus transitions the signal FB2 high so as to close the switch SW4 and tie the signal RAMP2 to the power supply voltage VDD. The signal FB1 is also transitioned low so as to open a switch SW3, thus allowing the signal RAMP1 to again begin transitioning downward from the power supply voltage VDD at a linear slope.

At a time T3, the signal RAMP1 reaches the voltage level NBIAS, thus causing the comparator 540 to transition. The transitioning of the output OUT1 of the comparator 530 at the IN1 node of logic circuit 300A causes the logic circuit 300A to transition its output signals. Therefore, the logic circuit 300A transitions the signal FB1 high, and the clock signal FB2 low. The transitioning of the signal FB1 high closes the switch SW3, thus tying the signal RAMP1 at the positively labeled input of the comparator 530 to the power supply voltage VDD. The transitioning of the signal FB2 low opens the switch SW4, thus allowing the signal RAMP2 at the input of the comparator 540 to again begin transitioning downward at a linear slope.

At time T4, the process repeats similar to what occurred at time T2. Thus, the signal RAMP2 transitions to the power supply voltage VDD as the signal FB2 transitions high and the switch SW4 is closed, and the signal RAMP1 again begins transitioning downward at a linear slope as the signal FB1 transitions low and the switch SW3 is opened. As a result of the above operations, the logic circuit 300A outputs the signal OSCOUT, as shown.

It should be appreciated that timing diagrams of FIG. 13 also illustrate the operation of the oscillator/clock generator of FIG. 10. With regard to FIG. 10, the signals RAMP1 and RAMP2 indicate the ramp signals internal to the delay blocks 120F1 and 120F2, respectively.

Figure 14:
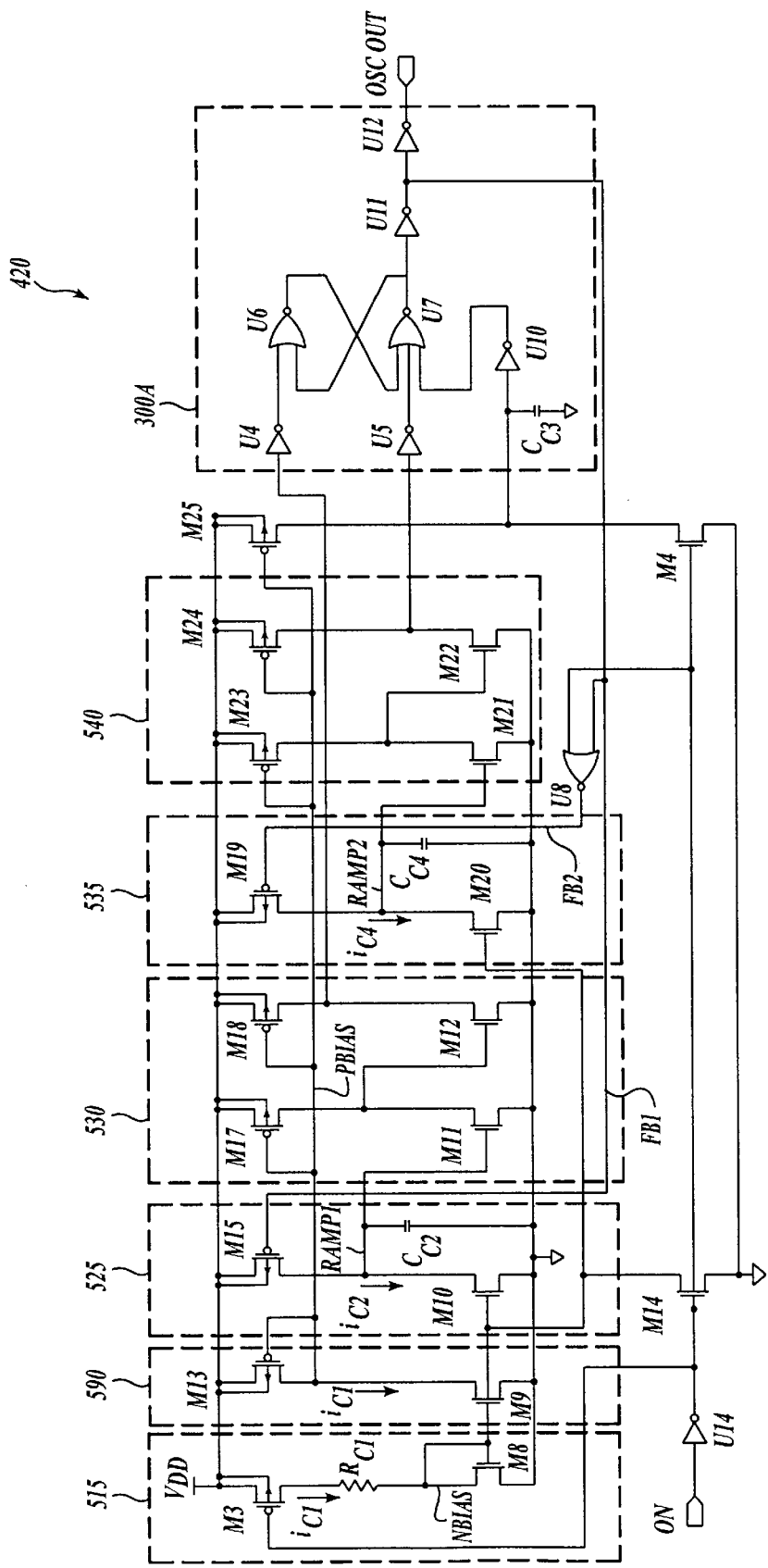
FIG. 14 is a detailed schematic diagram of one embodiment of the oscillator/clock generator of FIG. 12.

FIG. 14 is a detailed schematic diagram of one exemplary embodiment of a circuit which provides the functions of the oscillator/clock generator 420 of FIG. 12. As illustrated in FIG. 14, various portions of the circuit correspond to various components from the oscillator/clock generator of FIG. 12 with regard to function. However, in FIG. 14, two PMOS transistors M17 and M18, as well as two NMOS transistors M11 and M12 operate in an unconventional configuration to provide the function provided by the conventionally illustrated comparator 530 of FIG. 12, as described in detail below. Likewise, two PMOS transistors M23 and M24, as well as two NMOS transistors M21 and M22 operate in an unconventional configuration to provide the function provided by the conventionally illustrated comparator 540 of FIG. 12, as described in detail below.

The ramp circuits 525 and 535 are also shown in FIG. 14. As illustrated in FIG. 14, the ramp circuit 525 includes a PMOS transistor M15, an NMOS transistor M10, as well as the capacitor $C_{C2}$. The ramp circuit 535 includes a PMOS transistor M19, an NMOS transistor M20, as well as the capacitor $C_{C4}$.

A logic circuit 300A is also shown in FIG. 14. As illustrated, the logic circuit 300A includes five inverters U4, U5, U10, U11, and U12, as well as two OR gates U6 and U7, and a capacitor $C_{C3}$. Also illustrated in FIG. 14 is an exemplary embodiment of a current setting circuit 515 that is integrally coupled to a comparator governing circuit 590 that is usable according to the systems and methods of this invention. The comparator governing circuit 590 (not shown in FIG. 12) includes a PMOS transistor M13, as well as an NMOS transistor M9. As illustrated, the current setting circuit 515 is coupled to the comparator governing circuit 590 in a current mirror configuration.

As shown, the resistor $R_{C1}$ is connected to the power supply voltage VDD through PMOS transistor switch M3 and to the gate of NMOS transistor M8. Based on the operating characteristics of transistor M8, this configuration determines the threshold voltage NBIAS at the circuit node connected to the gate of M8 as well as a current $i_{C1}$ in the current setting circuit 515 which satisfies the condition NBIAS=VDD−($R_{C1}*i_{C1}$). As shown in FIG. 14, the current $i_{C1}$ is mirrored by the NMOS transistor M9. Thus the current flowing through PMOS transistor M13 of the comparator governing circuit 590, and which is connected to transistor M9, is also set at the level of the current $i_{C1}$. This current level programs the transistor M13 such that the gate voltage of the transistor M13 is set at a level corresponding to the current level of $i_{C1}$ and the operating characteristics of the transistor type used for M13.

As shown in FIG. 14, the PMOS transistors M17 and M23, which are sized at two times the size of transistor M13, are connected to transistor M13 in a current mirror configuration and are thus programmed for a current level of 2* $i_{C1}$. Furthermore, the NMOS transistor M11 which is connected to M17 is sized at two times the size of transistor M9, and is programmed by the current level of 2* $i_{C1}$ established by M17. Based on the current density through transistor M11, transistor M11 is thus controlled to exhibit a gate threshold voltage of NBIAS. Transistor M11 thus effectively functions as the signal input of a comparator which switches at a threshold voltage NBIAS. It should be appreciated that the transistors M23, M24, M21, and M22 of comparator 540 function identically to the corresponding transistors M17, M18, M11, and M12 of comparator 530.

As further shown in FIG. 14, the PMOS transistors M10 and M20 which are sized at two times the size of transistor M8, are also connected to transistor M8 in a current mirror configuration and are thus programmed for a current level of 2* $i_{C1}$. The PMOS transistors M10 and M20, serve to determine the discharge currents $i_{C2}$ and $i_{C4}$ of capacitor $C_{C2}$ and capacitor $C_{C4}$, respectively. Thus, in this exemplary embodiment of the clock circuit 420 of FIG. 14, the discharge currents $i_{C2}$ and $i_{C4}$ respectively, are each controlled to be two times the current $i_{C1}$ in the current setting circuit 515.

It should be appreciated that according to the foregoing discussion, the threshold voltage NBIAS of each comparator is ultimately controlled based on a common signal which is determined by particular characteristics of the current setting circuit 515. This is a significant aspect of circuit operation in various embodiments according to the systems and methods of this invention, as described in greater detail below. Furthermore, given particular transistor sizes for the transistors M10 and M20, it should be appreciated that discharge currents $i_{C2}$ and $i_{C4}$ are also controlled based the common signal which determines NBIAS, as determined by particular characteristics of the current setting circuit 515. This also is a significant aspect of circuit operation in various embodiments according to the systems and methods of this invention, as described in greater detail below.

Various other components are also shown in FIG. 14, including a PMOS transistor M25, NMOS transistors M4 and M14, an inverter U14, and an OR gate U8. Transistors M25 and M4 in conjunction with inverter U10 and capacitor $C_{C3}$ provide a delay for proper initialization of the clock when it is turned on.

The clock generator 420 shown in FIG. 12 and the embodiment of the clock generator 420 shown in FIG. 14 are each a dual ramp current-driven oscillator. With respect to FIG. 14, since the capacitors $C_{C2}$ and $C_{C4}$ are discharged at a rate of $2i_{C1}$, governed by the current density mirroring of transistors M10 and M20 respectively, the discharge rate is:

$$\frac{dv}{dt} = \frac{2 \cdot i_{C1}}{C_C} = \frac{2 \cdot (VDD - NBIAS)}{R_{R1} \cdot C_C} \quad \text{(Eq. 7)}$$

where $C_C = C_{C2}$ or $C_{C4}$, as appropriate.

Since the discharge will occur over the range from VDD to NBIAS, the clock period will be given by:

$$T_{clk} = 2 \cdot \frac{VDD - NBIAS}{\frac{dv}{dt}} = (R_{R1} C_C) \quad \text{(Eq. 8)}$$

For example, with $R_{R1}=2M\Omega$ and $C_C=0.5PF, T_{clk}=1uSec$.

Thus, it should be appreciated that the detailed circuit of FIG. 14 is a particularly simple and elegant way of implementing the circuit concepts according to this invention, such that the clock frequency is substantially independent of variations in the supply voltage and transistor process parameters. In particular, through the mirroring techniques described above, the trip-point voltage for the comparators 530 and 540, and the discharge current which governs the clock ramp signals in the comparators 530 and 540, are each controlled based on a common signal such that all voltage supply and transistor parameters variations become common mode factors which do not substantially affect the clock period during normal operation. Thus, the clock period depends only on the relevant resistor and capacitors as described above.

Figure 15:
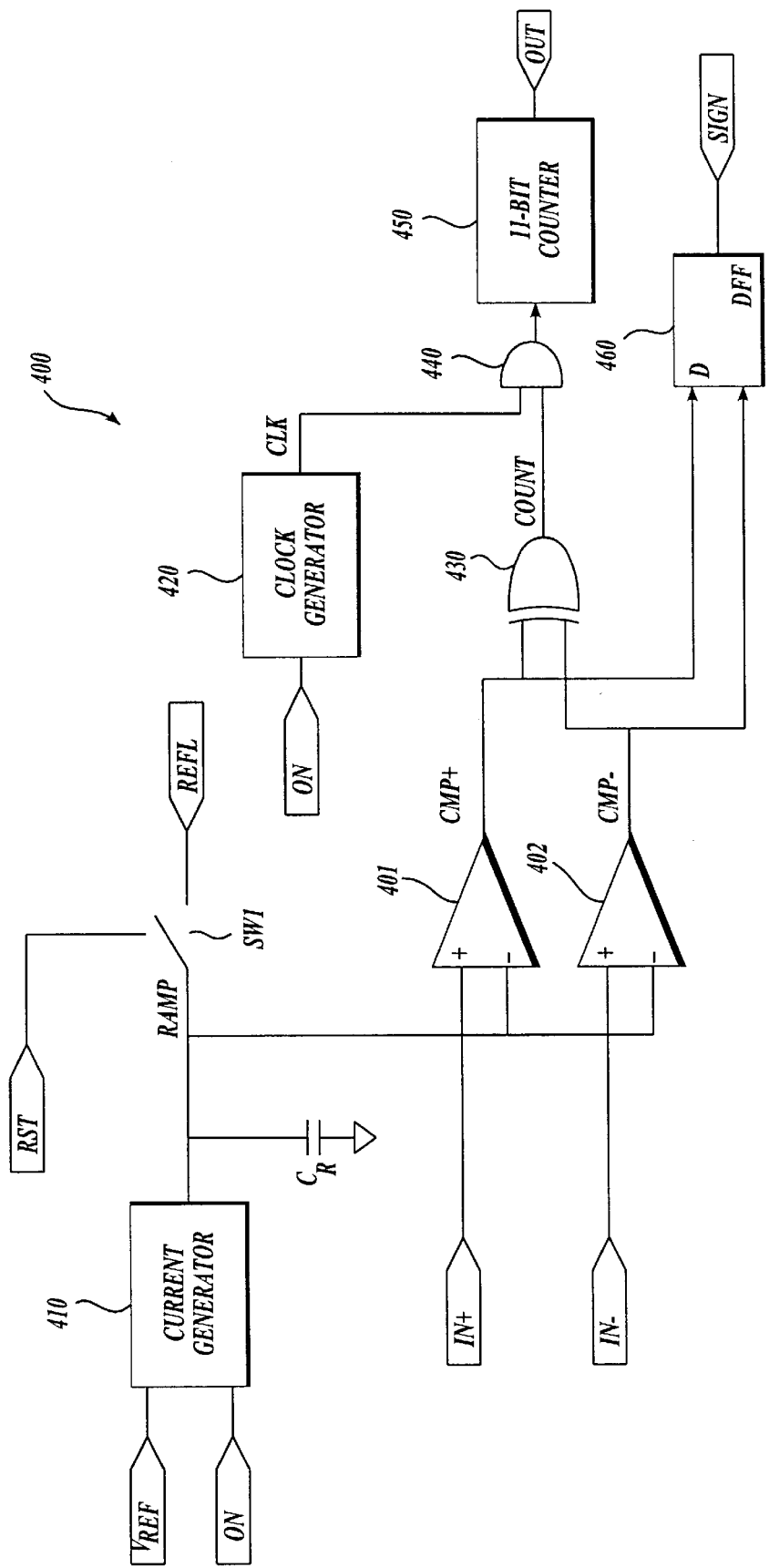
FIG. 15 is a block diagram of a logic circuit of one differential channel of an analog-to-digital converter utilizing a delay circuit.

FIG. 15 is a block diagram of a logic circuit 400 illustrating one application of the oscillator/clock generator of FIG. 10 or of FIGS. 12 and 14, which are usable as the clock generator 420 of the logic circuit 400. The logic circuit 400, incorporating delay/clock circuits according to this invention, is suitable for use as a low voltage low power differential input ADC. The overall system of this application is described in more detail in copending and commonly assigned U.S. patent application Ser. No. 09/898,674, entitled "Low Voltage Low Power Signal Processing System And Method For High Accuracy Comparison Of Differential Signal Inputs From A Portable Measuring Instrument," which is hereby incorporated by reference in its entirety.

As shown in FIG. 15, the signals IN+ and IN− are the differential signal to be converted by the logic circuit 400. The signals IN+ and IN− are provided to the positive inputs of each of the comparators 401 and 402, respectively. The signal RAMP is provided to the negatively labeled inputs of each of the comparators 401 and 402. The signal RAMP is provided by a current generator 410, which will be discussed in more detail below with reference to FIG. 16. The inputs to current generator 410 are the reference signal $V_{REF}$ and the signal ON. The reference signal $V_{REF}$ controls the current generator 410 and thus the ramp current and therefore the scale factor. In various exemplary embodiments, $V_{REF}$ is derived directly from the overall system power supply (using a divider), and the overall measurement system's scale factor (peak-to-peak counts for each signal derived from a transducer) is thereby made to be independent of the system supply voltage variations, as will be described in more detail below. In one 1.5V system embodiment, the reference signal $V_{REF}$ is at 0.75V, or one half of the power supply voltage.

A capacitor $C_R$ is coupled between the output of the current generator 410 and ground. A switch SW1 is controlled by control signal RST to couple the signal RAMP to a signal REFL. The signal RAMP is reset to the signal REFL, which is selected to be the lowest end of the input signal range, rather than ground in order to save time (and current). In one 1.5V system embodiment, with a signal range of 750 mV maximum (600 mV nominal), the signal REFL is set at approximately 375 mV.

The output signal CMP+ of comparator 401 is provided as both an input to an exclusive OR 430 gate and as an input to a DFF block 460. Similarly, the output signal CMP− of the comparator 402 is provided as an input to the exclusive OR gate 430 as well as an input to the DFF block 460. The output signal COUNT of the exclusive OR gate 430 is provided as an input to an AND gate 440. A second input of the AND gate 440 is a signal CLK received from a clock generator 420, which incorporates delay circuits which operate according to the principles disclosed herein. The clock generator 420 receives the input signal ON. The output of the AND gate 440 is provided to an 11 bit counter 450. The output of the counter 450 is the signal OUT. The output of the DFF block 460 is the signal SIGN. The signal SIGN adds an additional bit to the 11 bit output of the counter 450, thus creating an overall output of 12 bits of the logic circuit 400.

In the particular embodiment of the logic circuit 400 of FIG. 15, the counter 450 may be a ripple counter, which typically has a low current drain, since it minimizes the number of toggles. To minimize the number of registers, the count value is stored in the counter itself. It should also be noted that no subtraction circuit is needed. The sign signal SIGN is stored in a separate register. The end result of these design choices is a highly efficient circuit, both in terms of small size and low current drain. However, it will be appreciated that this is merely an exemplary embodiment and that other design choices may obviously be made.

Also in the embodiment of the logic circuit 400 of FIG. 15, the comparators may be implemented in any way suitable for low voltage low power operation. Either a low power operational amplifier-type comparator or a dynamic comparator may be used. The reader is referred to the chapter titled "Comparators" in *Analog Integrated Circuit Design* by David Johns and Ken Martin, published by John Wiley and Sons, Inc., 1997. Comparators having a switched capacitor input have the advantage of storing the input voltage on the input capacitor, which allows the preceding stage of the analog signal processing circuitry to be turned off, thereby saving power and facilitating cancellation of the comparator offset. In an embodiment using comparators having an internal switched capacitor input, the capacitor is preferably internally switchably connected to the input signal input during a reset phase, and just prior to conversion of an input signal, the input signal input is switchably disconnected and the ramp signal is switchably connected to the capacitor input at the start of the input signal conversion. In general, since the comparators are identical, any delays and parasitic effects should not affect accuracy and the choice of the low voltage low power comparator design is not critical.

Figure 16:
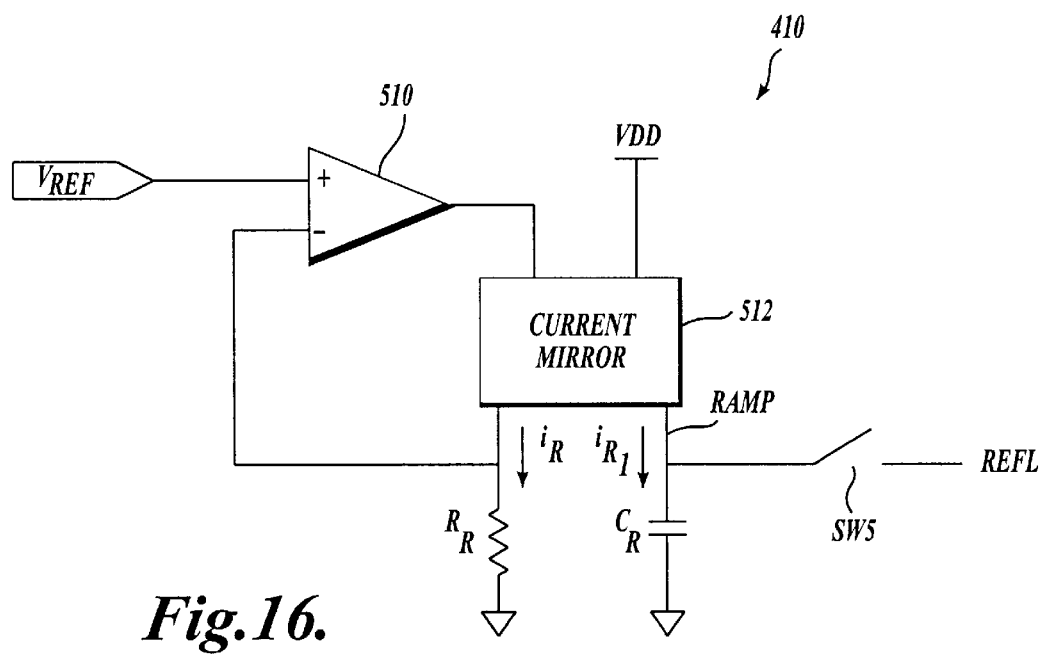
FIG. 16 is a block diagram of the current generator of FIG. 15.

FIGS. 10 and 12 are block diagrams of circuits usable as the clock generator 420 of FIG. 15 and FIG. 16 is a block diagram usable as the current generator 410 of FIG. 15. With regard to the design of these circuits, certain components are selected to reduce the sensitivity of the overall system to process parameters. More specifically, by using capacitors of the same type in the ramp generator and clock generator, and charging them with scaled bias currents, the scale factor of the system is made to be independent of process parameters.

FIG. 16 shows a block diagram of a circuit usable as the current generator 410 of FIG. 15 for generating the ADC ramp signal. An operational amplifier 510 receives the reference signal $V_{REF}$ at its positive input. The output of the amplifier 510 is provided to a current mirror 512. Current mirror 512 also receives power supply voltage VDD. The current mirror 512 is coupled through a resistor $R_R$ to ground, and the node between the resistor $R_R$ and the current mirror 512 is also coupled to the negative input of the amplifier 510. The output OUT of the current mirror 512 provides a current level equal to $I_{R1}$, which mirrors the current $I_R$ which passes through the resistor $R_R$. The output OUT from the current mirror 512 is coupled to the capacitor. The output OUT is also coupled through a switch SW5 to the reference signal REFL. The output signal OUT provides the ramp signal RAMP.

Figure 17A:
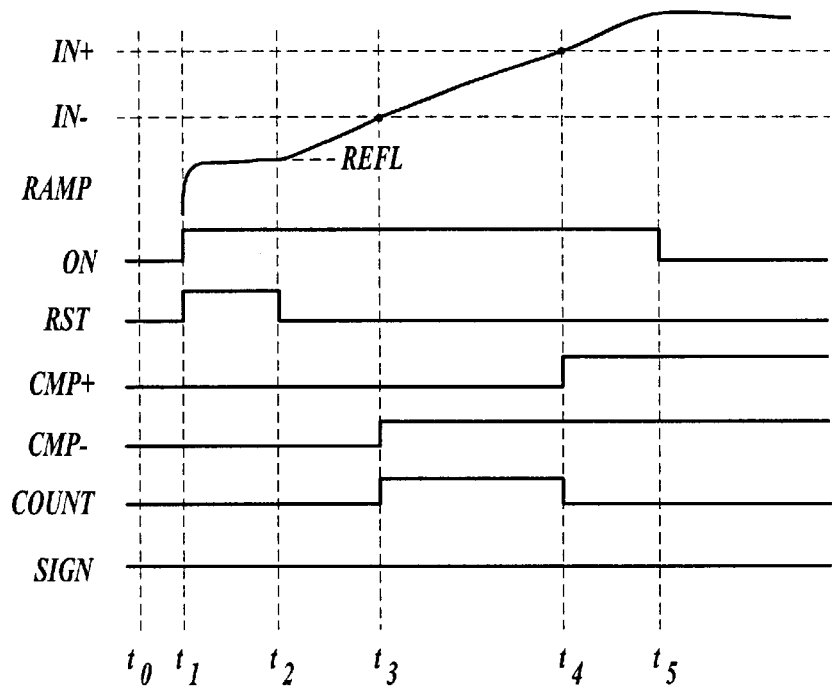
FIG. 17A is a timing diagram illustrating the operation of the logic circuit of FIG. 15 for a positive counter output value.
Figure 17B:
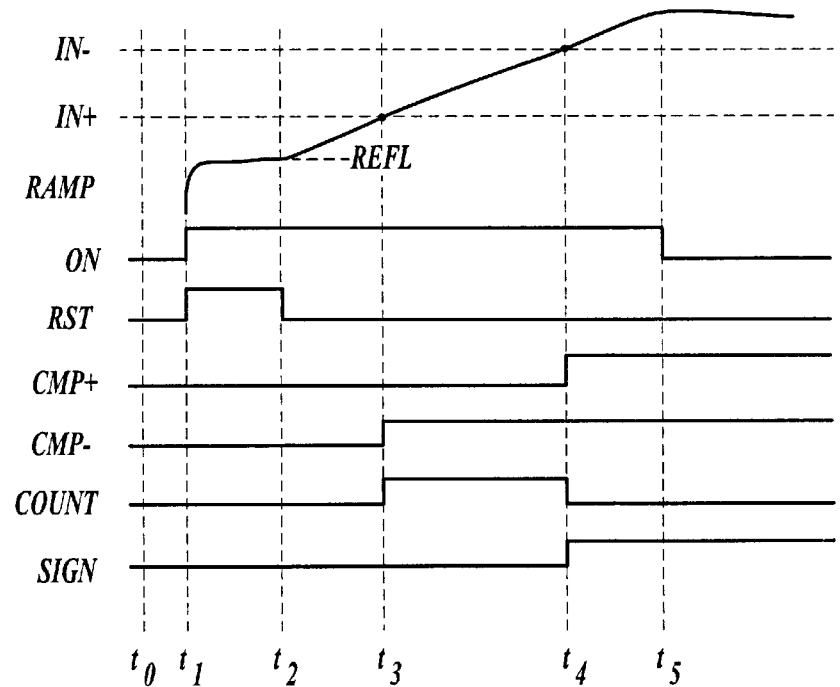
FIG. 17B is a timing diagram illustrating the operation of the logic circuit of FIG. 15 for a negative counter output value.

FIGS. 17A and 17B are timing diagrams illustrating the operation of the logic circuit 400 of FIG. 15. FIG. 17A illustrates an example of a positive counter output value, while FIG. 17B illustrates an example of a negative counter output value.

As illustrated in FIG. 17B, at a time T0 all of the signals are low. At a time T1, the signal ON transitions high, as does the signal RST. With reference to FIG. 15, the signal ON activates the current generator 410 and clock generator 420. The signal RST closes the switch SW1 so as to tie the output of the current generator 410 and consequently the signal RAMP to the signal level REFL. Thus, the signal RAMP rises to the signal level REFL.

At a time T2, the signal RST transitions low. With reference to FIG. 15, this opens the switch SW1 and allows the signal RAMP to increase at a linear rate as driven by the current generator 410. At a time T3, the signal RAMP passes the level of the input signal IN− of the comparator 402, and the output signal CMP− of the comparator 402 transitions high. This transition also causes the output COUNT of the exclusive OR gate 430 to transition high. This sequence, in combination with the clock generator output signal CLK, causes the counter 450 to start to count.

At a time T4, the signal RAMP passes the level of the input signal IN+ of the comparator 401. This causes the output of the comparator 401 to transition high, thus causing the output COUNT of the exclusive OR gate 430 to transition low, which through the AND gate 440 causes the counter 450 to stop counting. At a time T5, the signal ON transitions low and the signal RAMP stops increasing.

As described above, the sequence shown in FIG. 17A causes the counter 450 to produce a digital value that is representative of the difference between the analog levels of the signals IN+ and IN−. The fact that the signal SIGN from the output of the DFF block 460 remains low, indicates that the digital output represents a positive counter output value. This method provides a way to achieve a digital output of the difference between two differential analog signals.

FIG. 17B is similar to FIG. 17A except that it illustrates the function of the circuit for a negative counter output value. All of the signal levels are the same as in FIG. 17A, except that the levels of the signals IN+ and IN− have been swapped. Thus, at time T3, the signal RAMP passes the level of the signal IN+, thus causing the output CMP+ of the comparator 401 to transition high and start the counter 450. At time T4, the signal RAMP passes the level of the signal IN+, thus causing the output of CMP+ of the comparator 401 to transition high. This causes the output COUNT of the exclusive OR gate 430 to transition low, and stops the counter 450. One important difference between FIGS. 17A and 17B is that at time T4, in FIG. 17B, the output SIGN of the DFF block 460 transitions high. The signal SIGN being high provides an indication to the logic circuitry that the digital value from the counter 450 represents a negative counter output value.

The implementation of FIG. 15 along with the timing diagrams 17A and 17B, illustrate the startup circuit and shutdown features of an oscillator that can be turned on/off for temporary operation. This type of temporary operation is advantageous for minimizing power consumption.

In addition to the calculations for the clock generator components, it is also useful to examine the equations for the overall scale factor of an ADC according to the systems and methods of the application of FIG. 15. First of all, with regard to the current generator 410 of FIG. 16, the charging rate of the single ramp signal of an analog-to-digital converter, in various embodiments, is set by the bias circuit resistor $R_R$, the voltage level $V_{REF}$, and the ramp capacitor $C_R$.

The equation for calculating the related single ramp charging rate is shown below:

$$\left(\frac{dv}{dt}\right)_{ADC} = \frac{i_{R1}}{C_R} = \frac{V_{REF}}{(R_R C_R)} \qquad \text{(Eq. 9)}$$

If the exemplary clock circuit 420 of FIG. 14 is then used in conjunction with the exemplary single ramp current generator 410, the overall ADC scale factor will be:

$$SF_{ADC}\left[\frac{\text{counts}}{\text{Volt}}\right] = \frac{1}{T_{clk} \cdot \left(\frac{dv}{dt}\right)_{ADC}} = \frac{1}{V_{REF}} \cdot \frac{(R_R C_R)}{(R_C C_C)} \qquad \text{(Eq. 10)}$$

The relationship for the clock period, the single ramp charging rate, and the overall ADC scale factor, as shown by the above equations, has two important benefits. First, if the clock resistors and capacitors and the ADC ramp signal generator resistors and capacitors are constructed in a similar manner within a single integrated circuit, the device characteristics will generally match proportionally and the scale factor will be independent of process variations during fabrication. Furthermore, it should be appreciated the scale factor will be significantly independent of environmental variations when the circuit is operating, because the device operating characteristics that determined the scale factor are generally also matched proportionally according to the device design and fabrication, as described above.

Figure 18:
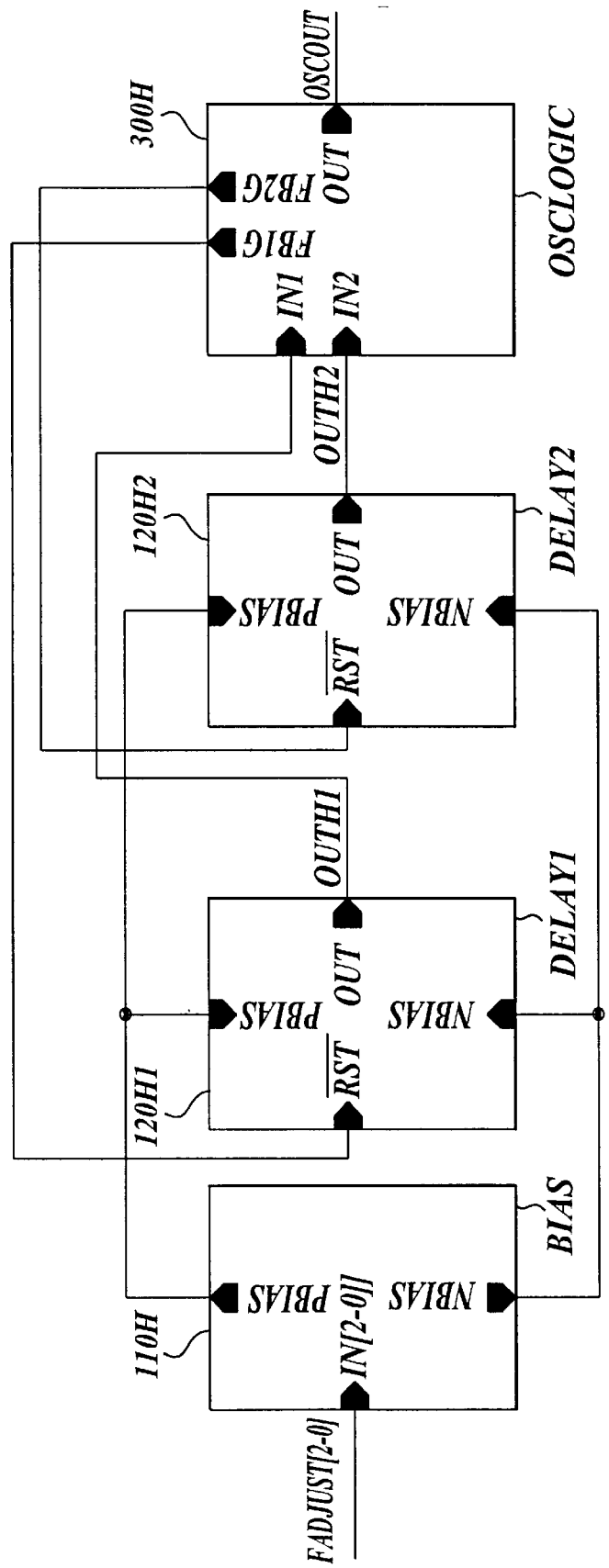
FIG. 18 is a block diagram of an adjustable frequency oscillator.

FIG. 18 shows a block diagram of an adjustable frequency oscillator. Since the resistor and capacitor values vary with integrated circuit processes, in some applications it is desirable to limit variation of the nominal frequency due to process variations by trimming the frequency. Typically, this can be done with fuses, or some type of PROM/EEPROM. Laser trimming of resistors is also possible, but is less frequently utilized. The oscillator circuit of FIG. 18 is similar to that of FIG. 10, except that it also includes frequency adjustment control signals FADJUST (2-0), which are received by the bias circuit 110H. The circuit also includes two delay blocks 120H1 and 120H2, as well as a logic circuit 300H.

Figure 19:
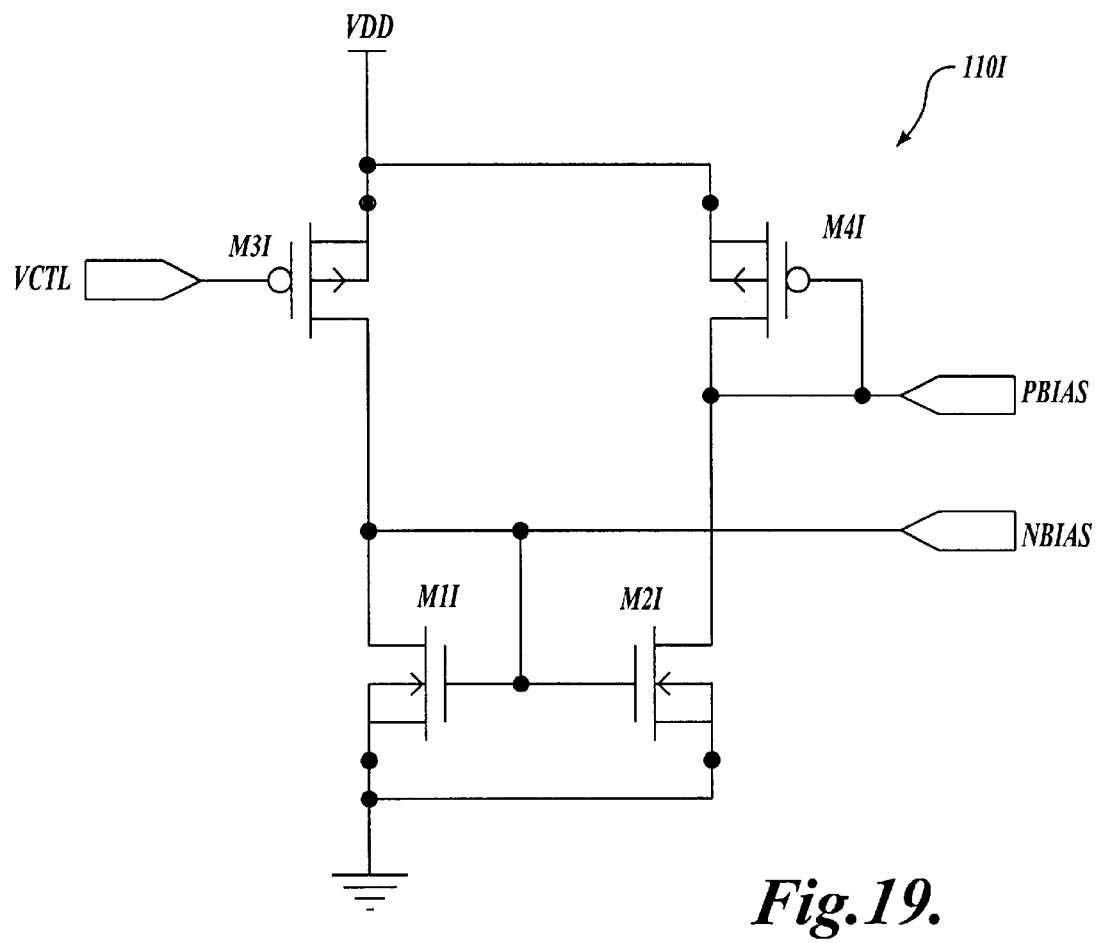
FIG. 19 is a schematic diagram of a voltage-controlled oscillator.

FIG. 19 is a schematic diagram of a voltage controlled oscillator bias circuit. A voltage controlled oscillator is another common application for on-chip oscillators. This type of circuit requires a voltage input to control the frequency. This can be accomplished by replacing the bias resistor by a PMOS transistor operating in the linear region, where it behaves as a voltage controlled resistor. As shown in FIG. 19, the bias resistor has been replaced by a PMOS transistor M3I, which receives a control signal VCTL. Transistor M3I would typically be a narrow, long transistor operating in the linear or triode region. As shown in FIG. 19, the bias circuit 101 includes the current mirror NMOS transistors M1I and M2I, as well as the PMOS transistor M4I.

Figure 20:
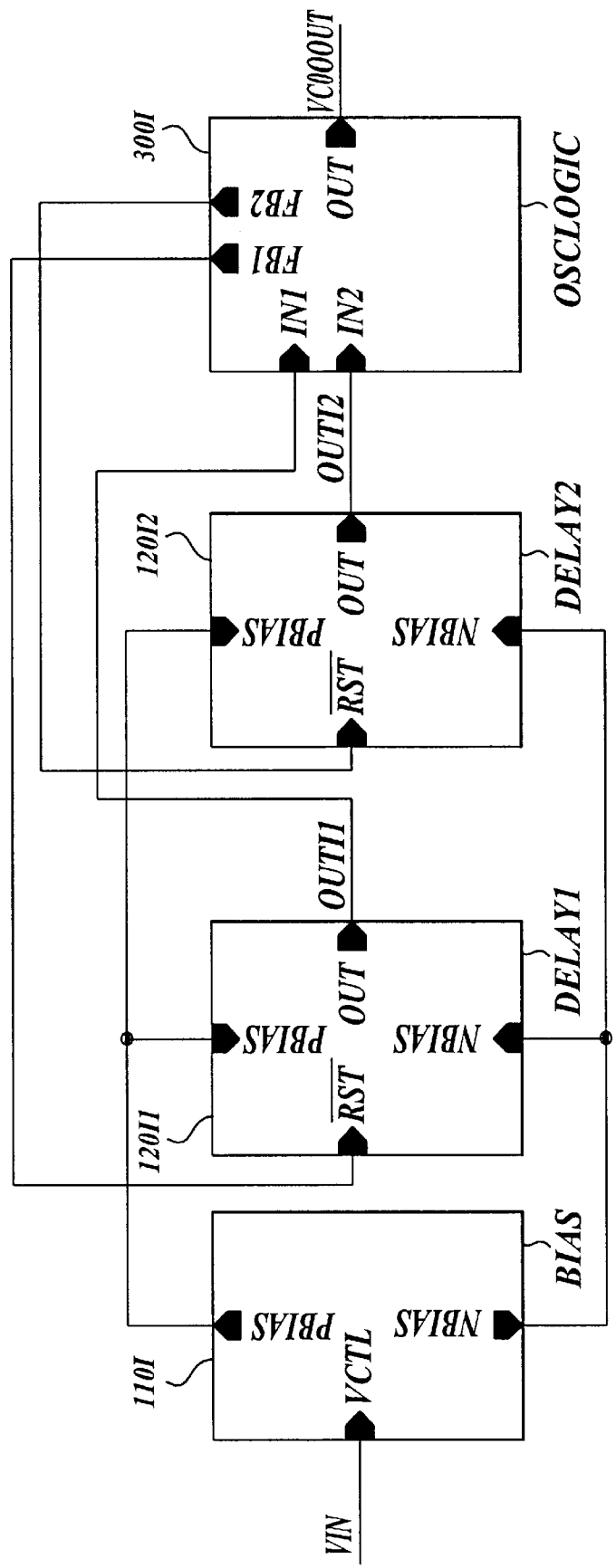
FIG. 20 is a block diagram of an oscillator/clock circuit utilizing the voltage controlled oscillator of FIG. 19.

FIG. 20 shows the voltage controlled oscillator that results from the utilization of the bias circuit 110I of FIG. 19. The circuitry of FIG. 20 is similar to the circuitry of FIG. 18, with the exception that the control signal received by the bias block 110I is signal VIN. The circuit also includes two delay blocks 120I1 and 120I2, as well as a logic circuit 300I.

Figure 21:
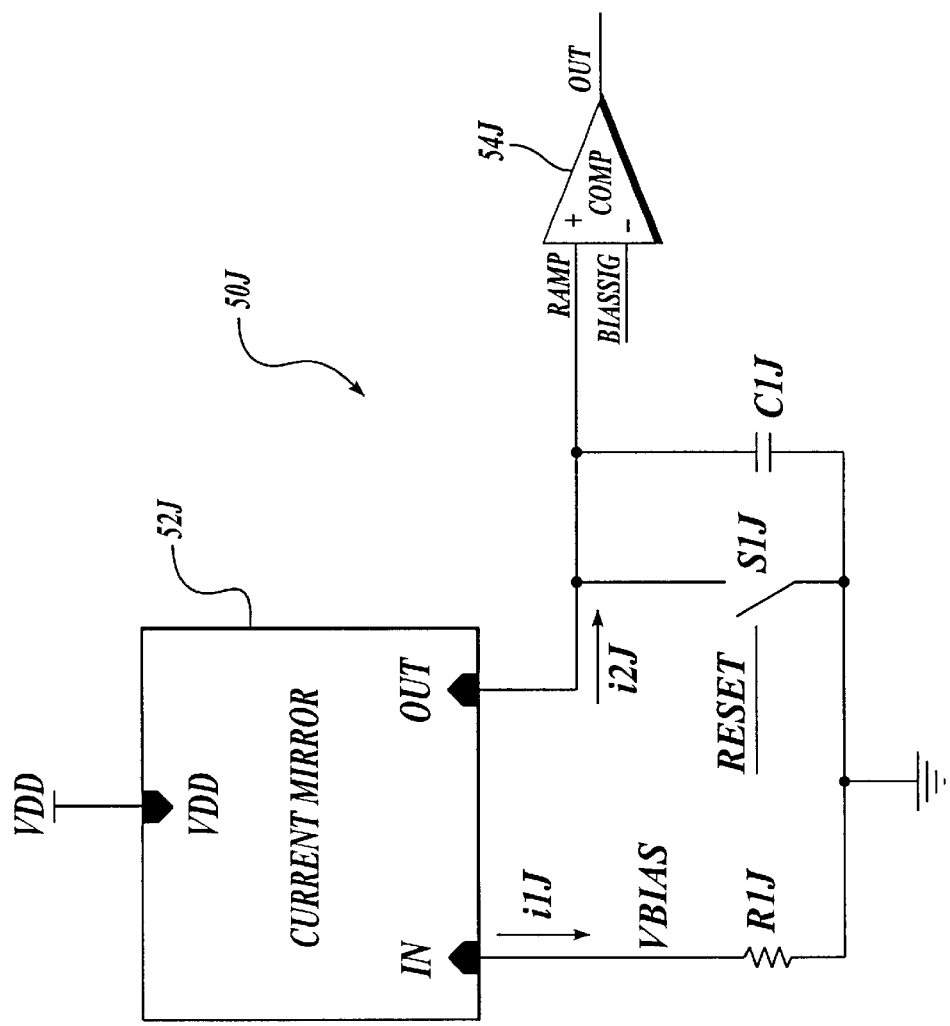
FIG. 21 is a block diagram of an alternative embodiment of a basic delay circuit illustrating the operating principles of the present invention.

FIG. 21 is a block diagram of an alternative embodiment of a basic delay circuit 50J formed in accordance with the present invention. The circuit configuration is analogous to the circuit configuration of delay circuit 50 of FIG. 1. However, in contrast to FIG. 1, a current mirror 52J is constructed using transistors of opposite polarity to those used in the construction of the current mirror 52 of FIG. 1. Thus, the current mirror 52J is coupled to the supply voltage VDD at a supply terminal, and is coupled in its input through a resistor R1J to circuit ground. As a result, a current $i_{1j}$ is established in the first branch of the current mirror 52J. The node between the resistor R1J and the input of the current mirror 52J determines the signal VBIAS. The second branch of the current mirror 52J is coupled to a positively labeled input of a comparator 54J. A signal RAMP is designated as the signal at the positively labeled input of the comparator 54J. The positively labeled input of the comparator 54J is also coupled through a switch S1J to ground. The positively labeled input of the comparator 54J is also coupled to a first terminal of a capacitor C1J. A second terminal of the capacitor C1J is coupled to ground. Switch S1J is controlled by a signal RESET. The switch S1J, the capacitor C1J, and the second branch of the current mirror 52J all form a ramp circuit. The negatively labeled input of the comparator 54J receives a signal BIASSIG which determines the trip point or switch point of the comparator 54J, as described in greater detail below.

A ramp signal is generated by charging the capacitor C1J with a current $i_{2j}$. The reference current $i_{1j}$ is set by the bias resistor R1. The current mirror input voltage is maintained at the voltage VBIAS. Thus, the current mirror outputs an operating current $i_{2j}$ identical to (or a multiple of) $i_{1j}$. The comparator 54J will trip or switch when the capacitor signal RAMP reaches a switching voltage VSWITCH, which is determined by the bias signal BIASSIG which governs the operation of the comparator 54J. When a conventional comparator is used for the comparator 54J, the switching voltage VSWITCH is equal to a reference voltage supplied to the comparator as the signal BIASSIG. In other exemplary embodiments described further below, the signal BIASSIG is not the same as the switching voltage VSWITCH, but the switching voltage VSWITCH is dependent on or interdependent with the signal BIASSIG.

The time delay is defined by the time elapsed from the falling edge of the reset signal to the rising edge of the comparator output (OUT), or:

$$t_d = \frac{VSWITCH}{dv/dt} \qquad \text{(Eq. 11)}$$

The time delay $t_d$ can be expressed as a function of the circuit parameters:

$$t_d = \frac{R1 \cdot C1}{k} \cdot \frac{VSWITCH}{VBIAS} \qquad \text{(Eq. 12)}$$

According to one aspect of the present invention, it should be appreciated that to the extent that a circuit design causes the voltages VSWITCH and VBIAS to approach the same value, the time delay interval determined by the delay circuit will tend to be stabilized against variations in the supply voltage. Furthermore, by making the voltages VSWITCH and VBIAS equal, the time delay now depends only on the resistor and capacitor values, and on the current mirror ratio k:

$$t_d = \frac{R1 \cdot C1}{k} \qquad \text{(Eq. 13)}$$

In this manner, similarly to the delay circuit 50 of FIG. 1, the time delay in the delay circuit 50J is made to depend only on the passive components R1 and C1 and the current mirror ratio k. Furthermore, when the transistors which are factors in the current mirror ratio k are fabricated in a common process, their operating characteristics will tend to track each other and the time delay interval determined by the delay circuit will tend to be additionally stabilized against variations with the operating temperature of the delay circuit. This enables the circuit to be implemented with simple transistor stages without introducing excessive variations due to supply voltage and temperature changes.

Figure 22:
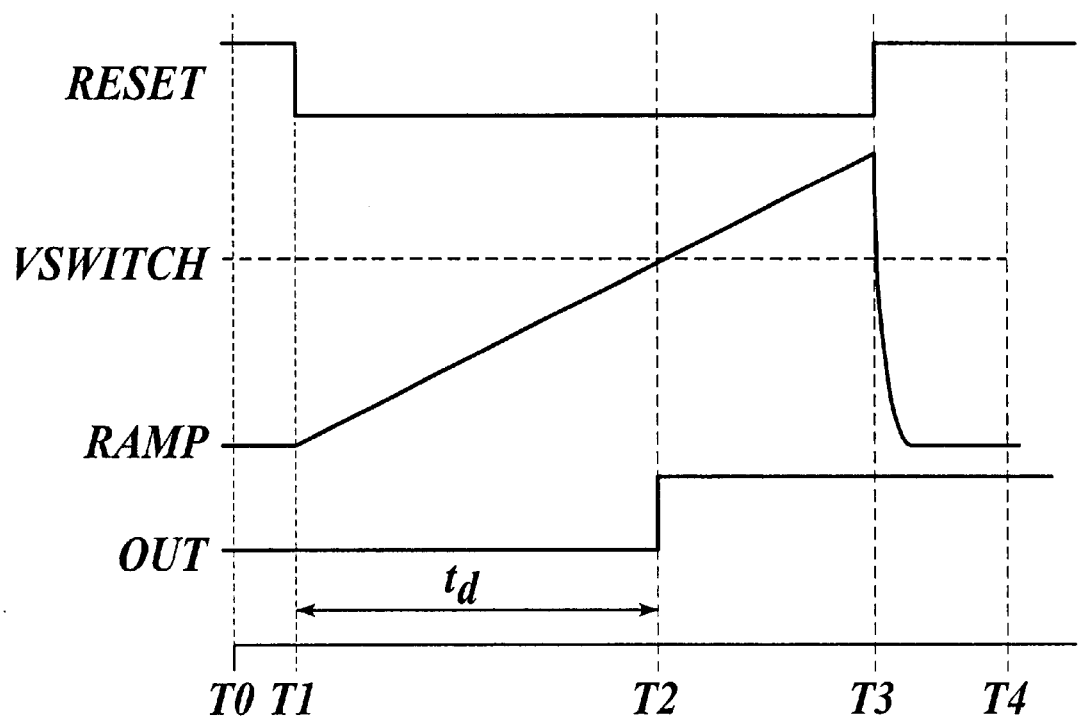
FIG. 22 is a timing diagram illustrating the operation of the circuitry of FIG. 21.

Furthermore, in various exemplary embodiments, the passive components R1 and C1 are also fabricated in a common process. This is particularly advantageous in circuits where several delay circuits and their related timing elements need to track with one another, as they can all be generated with resistors and capacitors of the same construction. Thus, all of the previously described advantages and features of the delay circuit 50 are achieved by the circuit 50J. FIG. 22 shows timing diagrams illustrating the operation of the delay circuit 50J of FIG. 21. As illustrated, at time T0 the signal RAMP is low, and the signal RESET is high. At a time T1, the signal RESET transitions low, which causes the ramp signal RAMP to begin transitioning upwards from ground voltage at a linear slope. At a time T2, the ramp signal RAMP reaches the signal level VSWITCH, which causes the output OUT of the comparator 54J to transition from low to high. The time delay $t_d$ is equal to the difference between times T2 and T1. At time T3, the signal RESET transitions high so as to close the switch S1J and tie the signal RAMP to the ground voltage. The signal RAMP thus transitions downward to the ground voltage, where it is seen at time T4.

Figure 23:
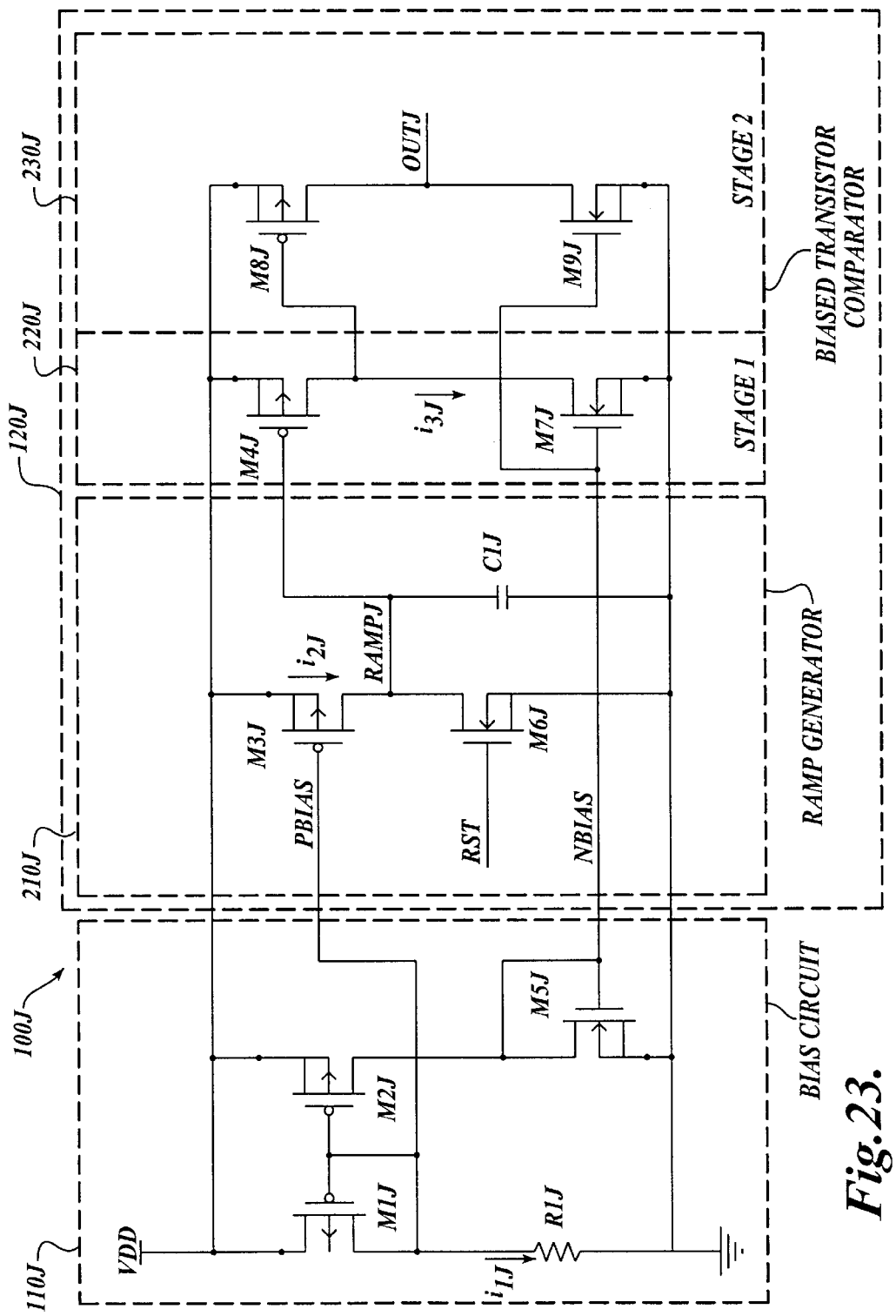
FIG. 23 is a schematic diagram illustrating one embodiment of the delay circuit of FIG. 21.

FIG. 23 is a schematic diagram of one embodiment of the delay circuit of FIG. 21. As shown in FIG. 23, the delay circuit 100J includes a bias circuit 110J and a delay block 120J. The delay block 120J includes a ramp generator 210J, and a biased transistor comparator according to one aspect of this invention with a first stage 220J and a second stage 230J.

The bias circuit 110J includes two PMOS transistors M1J and M2J coupled in a current mirror configuration. The first branch of the current mirror receives a current $i_{1j}$, which flows from the supply voltage VDD through a resistor R1J. The second branch of the current mirror is coupled through an NMOS transistor M5J to the ground voltage. The node between the resistor R1J and the first branch of the current mirror determines the signal PBIAS. The node between the transistors M5J and M2J determines the signal NBIAS.

The ramp generator 210J includes an PMOS transistor M3J, which is biased by the signal PBIAS. The transistor M3J is coupled to the supply voltage VDD and in series with a transistor M6J to ground. The transistor M6J is controlled by a signal NRST. The current through the transistor M3J is designated as $i_{2j}$. A capacitor C1J is coupled in parallel with the transistor M6J. The node on the capacitor C1J is designated as signal RAMPJ.

Both the first stage 220J and the second stage 230J of the comparator include one NMOS and one PMOS transistor coupled in series between the supply voltage VDD and ground. In the first stage 220J, the PMOS transistor M4J is controlled by the signal RAMPJ, while the NMOS transistor M7J is biased by the signal NBIAS. The node between the transistors M4J and M7J is coupled to the gate of PMOS transistor M8J of the second stage 230J. The current between the transistor M4J and the transistor M7J is designated as a current $i_{3j}$. The second stage 230J also includes an NMOS transistor M9J, which is also biased by the signal NBIAS. The node between the transistors M8J and M9J is designated as the output OUTJ.

To analyze the circuitry of FIG. 23, it can initially be seen that the bias current $i_{1j}$ is established by resistor R1J and transistor M1J. The voltage level PBIAS will be the gate voltage needed to drive transistor M1J at the bias current $i_{1j}$. The PMOS transistor M2J (and M3J) mirrors the bias current $i_{1j}$. Thus, the mirrored current at the level $i_{1j}$ also flows through NMOS transistor M5J, and determines the signal NBIAS based on the operating characteristics of the transistor M5J. The signal NBIAS then causes the transistors M7A and M9A to mirror the same bias current in the biased transistor comparator stages. This assumes that all the NMOS and PMOS transistors have respectively the same dimensions (k=1). In a practical implementation, the bias stage may operate at a lower current to save power, but with all the current mirror transistors operating at the same current density (k>1). To simplify the circuit description, we will assume that k=1. Various alternatives will be apparent to one skilled in the art.

For the ramp generator 210J, the transistor M3J will charge the capacitor C1J at the current $i_{2j}$, equal to the bias current $i_{1j}$, when the transistor M6J is not conducting. Transistor M6J is the reset switch, driven by the active high signal RST (RESET in FIG. 22.)

According to one aspect of operation of this invention, in order for this delay circuit to behave according to the discussion of Equation 13, the comparator needs to trip at the voltage PBIAS. This is accomplished by applying the signal NBIAS to the transistor M7J (and M9J), so the same bias current is further mirrored in the biased transistor comparator stages, in order to bias the transistor M4J at the same current density as transistor M1J. When the signal RAMPJ is low, transistor M4J will be on and driven/governed by the transistor M7J (current mirror output) and $i_{3j}=i_{1j}$.

When the capacitor C1J charges, the signal RAMPJ will increase linearly. When signal RAMPJ reaches the same voltage as the signal PBIAS, the transistor M4J will turn off and the biased transistor comparator will trip. Thus, it should be appreciated that the signal PBIAS is analogous to the voltage VBIAS in FIG. 21, and that the signal NBIAS is analogous to the signal BIASSIG of FIG. 21. Furthermore, it should be appreciated that according to this circuit configuration, for a given set of transistor operating characteristics, the signal NBIAS is determined by the signal PBIAS. This accomplishes one aspect of operation according to this invention, that is, it is insured that the comparator switching voltage is the same as the bias voltage PBIAS, in a manner that fulfills the conditions of Equation 13. Typically, transistors M8J and M9J form a second stage to increase the gain and square off the output signal OUTJ.

As noted above, it should be appreciated that the biased transistor comparator described above is not a conventional comparator and is not governed by a conventional reference voltage. Thus, conventional reference voltage circuits, along with their energy-dissipating resistors and independent circuit variations, are eliminated. Furthermore, comparator-like switching is accomplished with as little as one biasing transistor (e.g.-M7J) and one switching transistor (e.g.-M4J). Thus, the circuit can operate at very low supply voltages and provide very fast switching. It should be appreciated that the delay circuit embodiments shown in FIGS. 21–23 are analogous to the delay circuit embodiments shown in FIGS. 1–3, respectively. Therefore, the various modifications and applications of the delay circuit embodiment shown in FIGS. 6–20 with respect to the delay circuit embodiments shown in FIGS. 1–3 correspond to analogous modifications and applications with regarding to the delay circuit embodiments shown in FIGS. 21–23, as will be readily apparent to one skilled in the art.

The delay circuit embodiments shown in FIGS. 1–3 use NMOS transistors for the ramp generator and the comparator stages inputs, and PMOS transistors for the current mirrors biasing the comparator stages. The delay circuit embodiments shown in FIGS. 21–23 are implemented using the opposite polarity transistors, as described above. The embodiments of FIGS. 1–3 are better suited for higher speed applications, because the higher speed of the NMOS transistors makes them better for the comparator inputs, while the PMOS transistors are better used as current mirrors (or load). This results in a more accurate delay circuit, since the propagation delay in the comparator stages will be smaller. However, the embodiments of FIGS. 21–23 and their related modifications and applications provide all the advantages of low voltage low power operation and stable operation previously described with respect to the embodiments of FIGS. 1–20.

Figure 24:
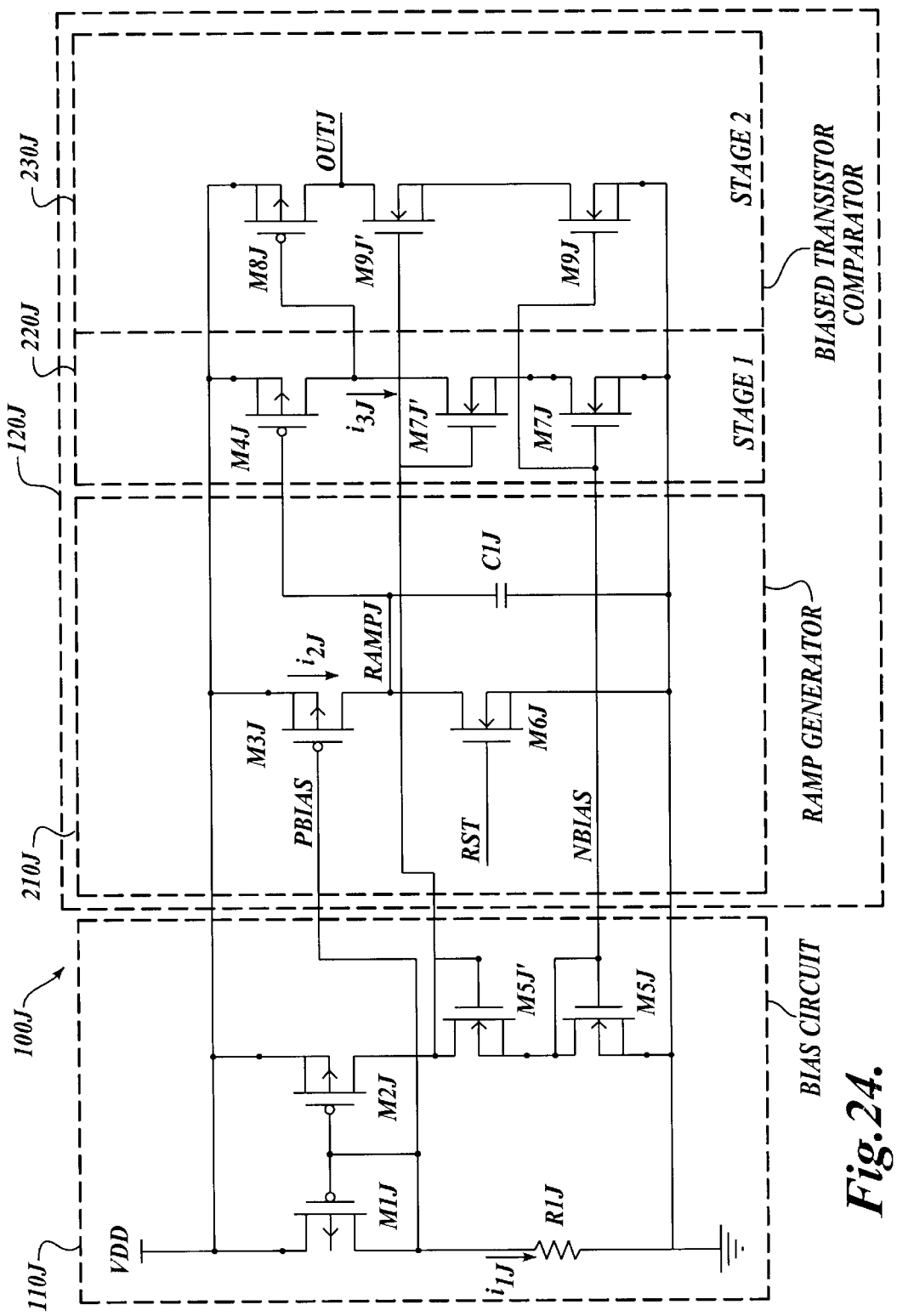
FIG. 24 is a schematic diagram illustrating a second embodiment of the delay circuit of FIG. 21.

FIG. 24 is a schematic diagram of a second embodiment of the delay circuit of FIG. 21. The embodiment of FIG. 24 is identical to the embodiment of FIG. 23, except with the addition of certain exemplary cascode transistors. The cascode transistors have been given a primed designation with respect to the transistors that they augment. For example, transistor M7J is coupled to cascode transistor M7J'. Thus, cascode transistors M5J', M7J', and M9J' are coupled to augment transistors M5J, M7J, and M9J, respectively. Other transistors shown in FIG. 24 may also be augmented by cascode transistors, provided that suitable bias signals are supplied to the cascode transistors by techniques that will be apparent to one skilled in the art.

It should be appreciated that all or part of the circuits described with regard to FIGS. 1–24 are suitable for combined fabrication in a single integrated circuit. Furthermore, while the circuits described with regard to FIGS. 1–24 are particularly advantageous for low power low voltage operation, it should be appreciated that circuits according to the systems and methods of this invention retain advantages when fabricated to operate at higher voltage levels. Furthermore, circuits implementations according to the systems and methods of this invention which are operable from a low voltage power supply at lower voltage levels, such as 1.35 volts, 1.5 volts, 3 volts, or 3.5 volts, for example, are also typically able to operate at voltage levels at least three to fives times higher, limited only by the voltage limitations of the processes used to fabricate the circuits. Furthermore, a number of the concepts and circuit portion described herein are advantageously usable both separately and in various combinations, thus, while the preferred embodiment and a limited number of other exemplary embodiments and variations of the invention have been illustrated and described, it will be appreciated that various changes can be made therein without departing from the spirit and scope of the invention.

The embodiments of the invention in which an exclusive property or privilege is claimed are defined as follows:

1. A low voltage low power delay circuit for determining a delay time interval comprising:

a bias circuit portion for generating first and second bias signals;

a ramp generator portion comprising at least one capacitor and a first transistor coupled to a first terminal of the at least one capacitor, the ramp generator generating a voltage ramp signal wherein a voltage change rate of the voltage ramp signal is controlled by a current level in the first transistor, the first transistor having a gate coupled to the bias circuit portion such that the current level in the first transistor is controlled by the first bias signal, the ramp generator further comprising a switch coupled to the at least one capacitor, the switch being operable by a reset signal so as to reset the voltage on the at least one capacitor;

a comparator portion comprising a second transistor having a gate coupled to receive the voltage ramp signal, wherein a switching threshold voltage at the gate of the second transistor is controlled by a current level in a third transistor coupled to the second transistor, the third transistor having a gate coupled to the bias circuit portion such that the current level in the third transistor is controlled by the second bias signal; and wherein a relationship between the voltage change rate of the ramp signal and the switching threshold voltage is at least partially governed by the first and second bias signals such that the delay time interval determined by the delay circuit tends to be stabilized against variations in a supply voltage supplied to the delay circuit during normal operation.

2. The delay circuit of claim 1, wherein the switching threshold voltage is nominally the same as a voltage level of the first bias signal.

3. The delay circuit of claim 1, wherein the second and third transistors are coupled in series.

4. The delay circuit of claim 3, wherein there are no other transistors coupled in series with the second and third transistors.

5. The delay circuit of claim 3, wherein when the voltage of the voltage ramp signal coincides with the switching threshold voltage a transition of a signal at a circuit node between the second and third transistors corresponds to an end of the delay time interval determined by the delay circuit.

6. The delay circuit of claim 3, wherein the second and third transistors are coupled through at least one operably connected cascode transistor.

7. The delay circuit of claim 3, wherein the comparator portion further comprises a fourth and fifth transistor coupled in series, the fifth transistor having a gate coupled to the bias circuit portion such that the current level in the fifth transistor is controlled by the second bias signal, and the gate of the fourth transistor is coupled to a circuit node between the second and third transistors.

8. The delay circuit of claim 7, wherein the fourth and fifth transistors are coupled through at least one operably connected cascode transistor.

9. The delay circuit of claim 7, wherein there are no other transistors coupled in series with the second and third transistors and no other transistors coupled in series with the fourth and fifth transistors.

10. The delay circuit of claim 7, wherein when the voltage of the voltage ramp signal coincides with the switching threshold voltage a transition of a signal at a circuit node between the fourth and fifth transistors determines an end of the delay time interval determined by the delay circuit.

11. The delay circuit of claim 1, wherein the switch operable by the reset signal is coupled in series with the first transistor, a first terminal of the switch coupled to the first terminal of the capacitor and to the first transistor, wherein a transition of the reset signal corresponds to a start of the delay time interval determined by the delay circuit.

12. The delay circuit of claim 11, wherein the switch comprises a transistor switch and there are no other transistors coupled in series with the first transistor and the transistor switch.

13. The delay circuit of claim 1, wherein the voltage change rate of the ramp signal is governed at least partially by the first bias signal, the switching threshold voltage is governed at least partially by the second bias signal, and a relationship between the first and second bias signals is governed such that the delay time interval determined by the delay circuit is substantially insensitive to variations in a supply voltage supplied to the delay circuit during normal operation.

14. The delay circuit of claim 13, wherein the bias circuit portion comprises a current mirror comprising:

a reference current leg comprising a reference leg transistor coupled in series with at least one other reference leg component, the reference leg transistor gate connected such that the voltage at the reference leg transistor gate is determined by a current flowing through the reference leg transistor;

a mirrored current leg comprising a mirror transistor and a load transistor, the mirror transistor coupled to the reference leg transistor in a current mirror configuration, the load transistor coupled in series to the mirror transistor, the load transistor having a gate that is connected such that the voltage at the load transistor gate is determined by a current flowing through the load transistor; and wherein the first bias signal is a signal present at the reference leg transistor gate and the second bias signal is a signal present at the load transistor gate.

15. The delay circuit of claim 14, wherein there are no other transistors coupled in series with the load transistor and the mirror transistor and the load transistor gate is connected to the circuit node between the load transistor and the mirror transistor.

16. The delay circuit of claim 14, wherein:

the gate of the first transistor is coupled to the reference leg transistor gate;

the gate of the third transistor is coupled to the load transistor gate, and the mirror transistor, the first transistor and the second transistor are of one of p-type and n-type transistors and the load transistor and the third transistor are of the other of p-type and n-type transistors.

17. The delay circuit of claim 16, wherein:

the operating characteristics of the third transistor and the load transistor are such that the third transistor and the load transistor operate at the same current density for a given gate voltage; and the operating characteristics of the mirror transistor, the first transistor and the second transistor are such that the mirror transistor, the first transistor and the second transistor operate at the same current density for a given gate voltage.

18. The delay circuit of claim 14, wherein the at least one other reference leg component comprises a resistor, the reference leg transistor is coupled in series to a first terminal of the resistor, and the reference leg transistor gate is connected to the first terminal of the resistor.

19. The delay circuit of claim 18, wherein the reference leg transistor is coupled in series to the first terminal of the resistor through at least one operably connected cascode transistor.

20. The delay circuit of claim 14, wherein the load transistor is coupled in series to the mirror transistor through at least one operably connected cascode transistor.

21. The delay circuit of claim 20, wherein the at least one operably connected cascode transistor is associated with the load transistor, and the load transistor gate is connected to the circuit node between the at least one operably connected cascode transistor and the mirror transistor.

22. The delay circuit of claim 20, wherein the at least one operably connected cascode transistor is associated with the mirror transistor, and the load transistor gate is connected to the circuit node between the load transistor and the at least one operably connected cascode transistor.

23. The delay circuit of claim 1, wherein the delay circuit is operable from a low voltage power supply providing a voltage less than 3.5 volts.

24. The delay circuit of claim 1, wherein the delay circuit is operable from a low voltage power supply providing a voltage less than 1.75 volts.

25. The delay circuit of claim 1, wherein the delay circuit is operated from a portable low power low voltage power supply.

26. The delay circuit of claim 25, wherein the portable low power low voltage power supply comprises at least one of a battery and solar cell.

27. The delay circuit of claim 26, wherein the battery comprises at least one of a 3 volt coin type battery, a 3 volt button type battery, a 1.5 volt coin type battery, and a 1.5 volt button type battery.

28. The delay circuit of claim 1, wherein the bias circuit portion comprises an adjustable bias circuit usable to adjust the delay time interval of the delay circuit.

29. The delay circuit of claim 1, wherein the ramp generator portion comprises an adjustable ramp generator portion usable to adjust the delay time interval of the delay circuit.

30. The delay circuit of claim 29, wherein the at least one capacitor comprises a plurality of capacitors having first terminals adjustably couplable to the first transistor.

31. The delay circuit of claim 1, wherein the delay circuit determines a first delay time interval, and the delay circuit further comprises at least one delay block comprising an additional ramp generator portion and an additional comparator portion, the at least one delay block determining at least a second delay time interval, and the delay circuit providing at least one signal that is determined based on a combination of at least the first and second delay time intervals.

32. The delay circuit of claim 31, wherein at least the first and second delay time intervals are sequential delay time intervals and the at least one signal is determined based at least partly on an accumulation of sequential delay time intervals.

33. The delay circuit of claim 31, wherein at least the first and second delay time intervals are synchronized delay time intervals and the at least one signal comprises a plurality of synchronized delay signals.

34. The delay circuit of claim 31, wherein the at least one signal determined based on a combination of at least the first and second delay time intervals comprises a repetitive clock signal.

35. The delay circuit of claim 34, wherein the repetitive clock signal is counted by a counting circuit, as a basis for determining a digital value in an analog to digital converter.

36. The delay circuit of claim 1, wherein the delay circuit is controllable to conserve power by starting operation at the start of selected periods and stopping operation at the end of selected periods.

37. The delay circuit of claim 1, wherein the first transistor is coupled to the first terminal of the capacitor through at least one operably connected cascode transistor.

38. The delay circuit of claim 1, wherein the relationship between the voltage change rate of the ramp signal and the switching threshold voltage is at least partially governed by the first and second bias signals such that the delay time interval determined by the delay circuit is substantially insensitive to variations in a supply voltage supplied to the delay circuit during normal operation.

39. The delay circuit of claim 1, wherein the first transistor is coupled to the bias circuit portion in a current mirror configuration, and the third transistor is also coupled to the bias circuit portion in a current mirror configuration.

40. The delay circuit of claim 1, wherein the bias circuit portion comprises a current mirror, the current mirror having a reference leg resistor having a first terminal connectable to one of a positive rail and a negative rail of a power supply, wherein the first bias signal is the signal at a second terminal of the resistor.

41. The delay circuit of claim 1, wherein the current levels in the first and third transistors are nominally constant during the normal operation of the delay circuit during the delay time interval.

42. The delay circuit of claim 1, wherein a second terminal of the capacitor is connected to ground.

43. A low voltage low power delay circuit for determining a delay time interval comprising:

a bias circuit portion for generating first and second bias signals;

a ramp generator portion comprising a capacitor and a first transistor coupled to a first terminal of the capacitor, the ramp generator generating a voltage ramp signal wherein a voltage change rate of the voltage ramp signal is controlled by a current level in the first transistor, the first transistor having a gate coupled to the bias circuit portion such that the current level in the first transistor is controlled by the first bias signal, the ramp generator further comprising a reset switch coupled to the capacitor, the reset switch being operable by a reset signal so as to reset the voltage on the capacitor; and a comparator portion comprising a second transistor having a gate coupled to receive the voltage ramp signal, wherein a switching threshold voltage at the gate of the second transistor is controlled by a current level in a third transistor coupled to the second transistor, the third transistor having a gate coupled to the bias circuit portion such that the current level in the third transistor is controlled by the second bias signal; and wherein a relation ship between the voltage change rate of the ramp signal and the switching threshold voltage is at least partially governed by the first and second bias signals such that the delay time interval determined by the delay circuit tends to be stabilized against temperature-induced variations in the operating characteristics of at least the first, second and third transistors during normal operation.

44. The delay circuit of claim 43, wherein the switching threshold voltage is nominally the same as a voltage level of the first bias signal.

45. The delay circuit of claim 43, wherein at least the first, second and third transistors of the delay circuit are fabricated on a single integrated circuit substrate.

46. The delay circuit of claim 45, wherein all of the components of the delay circuit are fabricated on a single integrated circuit substrate.

47. A low voltage low power delay circuit for determining a delay time interval comprising:

a bias circuit portion for generating first and second bias signals;

a ramp generator portion comprising a first transistor, the ramp generator portion coupled to the bias circuit portion, the ramp generator generating a voltage ramp signal wherein a voltage change rate of the voltage ramp signal is governed by the first bias signal, the ramp generator portion further comprising a switch operable by a reset signal, wherein a transition of the reset signal corresponds to a start of the delay time interval determined by the delay circuit; and a comparator portion comprising a second transistor having a gate coupled to receive the voltage ramp signal, wherein a switching threshold voltage at the gate of the second transistor is controlled by a current level in a third transistor coupled to the second transistor, the third transistor further coupled to the bias circuit portion in a current mirror configuration such that the current level in the third transistor is governed by the second bias signal; and wherein a relationship between the voltage change rate of the ramp signal and the switching threshold voltage is at least partially governed by the first and second bias signals such that the delay time interval determined by the delay circuit tends to be stabilized against variations in a supply voltage supplied to the delay circuit during normal operation.

48. The delay circuit of claim 47, wherein the ramp portion further comprises a capacitor, the first transistor coupled to a first terminal of the capacitor, the voltage change rate of the voltage ramp signal being controlled by a current level in the first transistor, the first transistor further coupled to the bias circuit portion in a current mirror configuration such that the current level in the first transistor is controlled by the first bias signal.

49. A low voltage low power delay circuit for determining a delay time interval comprising:

a bias circuit portion for generating first and second bias signals;

a ramp generator portion comprising at least one capacitor and a first transistor coupled to a first terminal of the at least one capacitor, the ramp generator generating a voltage ramp signal wherein a voltage change rate of the voltage ramp signal is controlled by a current level in the first transistor, the first transistor having a gate coupled to the bias circuit portion such that the current level in the first transistor is controlled by the first bias signal, the ramp generator further comprising a switch coupled to the at least one capacitor, the switch being operable by at least one reset signal so as to reset the voltage on the capacitor and initiate the delay time interval;

a comparator portion comprising a second transistor having a gate coupled to receive the voltage ramp signal, wherein a switching threshold voltage at the gate of the second transistor is controlled by a current level in a third transistor coupled to the second transistor, the third transistor having a gate coupled to the bias circuit portion such that the current level in the third transistor is controlled by the second bias signal; and the switching threshold voltage at the gate of the second transistor being nominally the same as a voltage level of the first bias signal.

* * * * *

UNITED STATES PATENT AND TRADEMARK OFFICE
CERTIFICATE OF CORRECTION

PATENT NO. : 6,747,500 B2
DATED : June 8, 2004
INVENTOR(S) : P.H. Mawet

It is certified that error appears in the above-identified patent and that said Letters Patent is hereby corrected as shown below:

<u>Title page,</u>
Item [56], References Cited, insert the following:
-- FOREIGN PATENT DOCUMENTS
DE     19945949     3/2001 --.

Signed and Sealed this

Twenty-third Day of May, 2006

JON W. DUDAS
*Director of the United States Patent and Trademark Office*